United States Patent
Howder et al.

(10) Patent No.: US 10,748,922 B2
(45) Date of Patent: Aug. 18, 2020

(54) MEMORY ARRAYS AND METHODS USED IN FORMING A MEMORY ARRAY

(71) Applicant: Micron Technology, Inc., Boise, ID (US)

(72) Inventors: Collin Howder, Meridian, ID (US); Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/203,200

(22) Filed: Nov. 28, 2018

(65) Prior Publication Data

US 2020/0168624 A1  May 28, 2020

(51) Int. Cl.
| | |
|---|---|
| *H01L 27/11582* | (2017.01) |
| *G06F 3/06* | (2006.01) |
| *H01L 27/1157* | (2017.01) |
| *H01L 27/11556* | (2017.01) |
| *H01L 27/11524* | (2017.01) |

(52) U.S. Cl.
CPC ...... *H01L 27/11582* (2013.01); *G06F 3/0688* (2013.01); *H01L 27/1157* (2013.01); *H01L 27/11524* (2013.01); *H01L 27/11556* (2013.01)

(58) Field of Classification Search
CPC ......... H01L 27/11582; H01L 27/11524; H01L 27/11556; H01L 27/1157; G06F 3/0688
USPC ......... 257/314, 315, 316, 321, 324, 329, 39, 257/774, E21.41, E21.422, E21.423, 257/E21.582, E21.679, E21.159, E23.141, 257/E23.16, E23.01, E27.103, E27.081, 257/E29.309, E29.3, E29.273, E29.278; 365/185.17, 185.18, 185.05; 438/157, 438/268, 269, 478, 637, 666
See application file for complete search history.

(56) References Cited

U.S. PATENT DOCUMENTS 5,043,299 A    8/1991  Chang et al.
9,553,168 B2 * 1/2017  Kwak ............... H01L 27/11582
(Continued)

FOREIGN PATENT DOCUMENTS

KR   10-2011-0034816   4/2011
WO   PCT/US2019/057142   2/2020

OTHER PUBLICATIONS

U.S. Appl. No. 15/675,130, filed Aug. 11, 2017, by Carlson.
(Continued)

*Primary Examiner* — Dao H Nguyen
(74) *Attorney, Agent, or Firm* — Wells St. John P.S.

(57) ABSTRACT

A memory array comprises a vertical stack comprising alternating insulative tiers and wordline tiers. The wordline tiers comprise gate regions of individual memory cells. The gate regions individually comprise part of a wordline in individual of the wordline tiers. Channel material extends elevationally through the insulative tiers and the wordline tiers. The individual memory cells comprise a memory structure laterally between the gate region and the channel material. Individual of the wordlines comprise laterally-outer longitudinal-edge portions and a respective laterally-inner portion laterally adjacent individual of the laterally-outer longitudinal-edge portions. The individual laterally-outer longitudinal-edge portions project upwardly and downwardly relative to its laterally-adjacent laterally-inner portion. Methods are disclosed.

13 Claims, 18 Drawing Sheets

(56) References Cited

U.S. PATENT DOCUMENTS

| | | |
|---|---|---|
| 2011/0073866 A1 | 3/2011 | Kim et al. |
| 2011/0147824 A1* | 6/2011 | Son ................... G11C 16/0483 |
| | | 257/324 |
| 2012/0012920 A1 | 1/2012 | Shin et al. |
| 2012/0077320 A1* | 3/2012 | Shim ................ H01L 27/11582 |
| | | 438/269 |
| 2012/0092926 A1* | 4/2012 | Whang ............. H01L 27/11556 |
| | | 365/185.01 |
| 2013/0148398 A1 | 6/2013 | Baek et al. |
| 2013/0168752 A1* | 7/2013 | Kim .................. H01L 27/11582 |
| | | 257/314 |
| 2013/0171788 A1 | 7/2013 | Yang et al. |
| 2015/0060993 A1 | 3/2015 | Lee et al. |
| 2015/0069494 A1 | 3/2015 | Makala et al. |
| 2016/0071861 A1 | 3/2016 | Serov et al. |
| 2016/0148949 A1 | 5/2016 | Jayanti et al. |
| 2016/0163725 A1 | 6/2016 | Kamiya et al. |
| 2017/0069644 A1* | 3/2017 | Kikushima ....... H01L 27/11556 |
| 2018/0204849 A1 | 7/2018 | Carlson et al. |
| 2018/0219020 A1 | 8/2018 | Hopkins et al. |

OTHER PUBLICATIONS

U.S. Appl. No. 15/675,197, filed Aug. 11, 2017, by Carlson.
U.S. Appl. No. 15/675,265, filed Aug. 11, 2017, by Carlson et al.
U.S. Appl. No. 15/848,612, filed Dec. 20, 2017, by Greenlee et al.
U.S. Appl. No. 16/177,220, filed Oct. 31, 2018, by Kim et al.
U.S. Appl. No. 16/179,572, filed Nov. 2, 2018, by Kim et al.
Wu et al., "Improving Tungsten Gap-fill for Advanced Contact Metallization", IEEE International Interconnect Technology Conference/Advanced Metallization Conference (IITC/AMC), May 23-26, 2016, San Jose, California, pp. 171-173.

\* cited by examiner

MEMORY ARRAYS AND METHODS USED IN FORMING A MEMORY ARRAY

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

DETAILED DESCRIPTION OF EXAMPLE EMBODIMENTS

Embodiments of the invention encompass methods used in forming an array of transistors and/or memory cells, for example an array of NAND or other memory cells having peripheral control circuitry under the array (e.g., CMOS under-array). Embodiments of the invention encompass so-called "gate-last" or "replacement-gate" processing, so-called "gate-first" processing, and other processing whether existing or future-developed independent of when transistor gates are formed. Embodiments of the invention also encompass an array of transistors and/or memory cells (e.g., NAND or other memory cells) independent of method of manufacture. First example method embodiments are described with reference to FIGS. 1-15 (including FIGS. 1A, 12A, 13A, 14A, 14B, and 15A) which may be considered as a "gate-last" or "replacement-gate" process.

Figure 1:
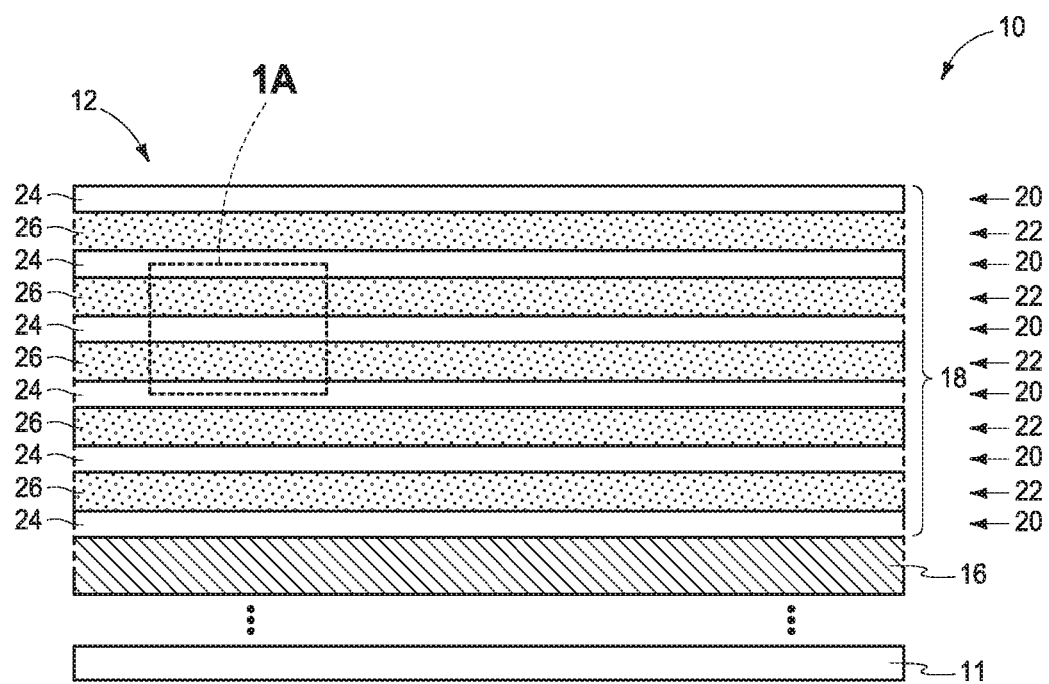
FIG. 1 is a diagrammatic cross-sectional view of a portion of a substrate in process in accordance with an embodiment of the invention.
Figure 1A:
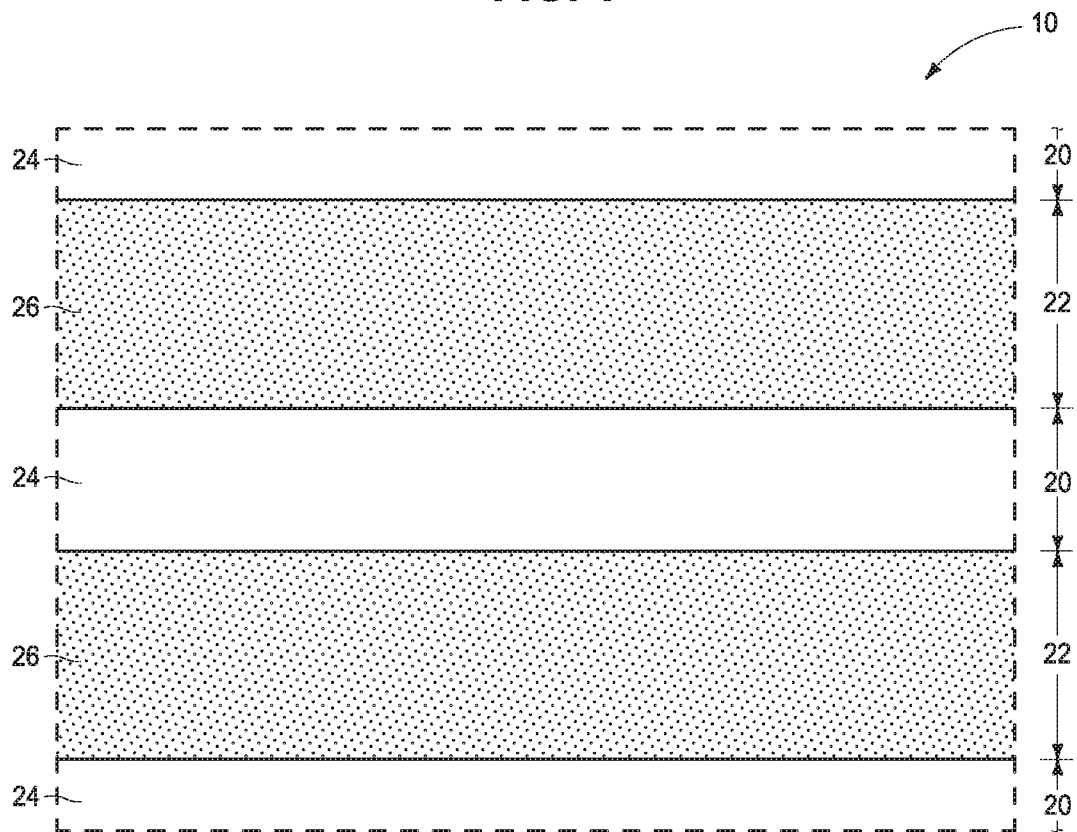
FIG. 1A is an enlarged view of a portion of FIG. 1.

FIGS. 1 and 1A show a substrate construction 10 in process in a method of forming an array 12 of elevationally-extending strings of transistors and/or memory cells (not yet shown). Substrate construction 10 comprises a base substrate 11 having any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 1A-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Substrate construction 10 comprises a stack 18 comprising vertically-alternating insulative tiers 20 and wordline tiers 22 directly above an example conductively-doped semiconductor material 16 (e.g., conductively-doped polysilicon above metal material). Wordline tiers 22 may not comprise conductive material and insulative tiers 20 may not comprise insulative material or be insulative at this point in processing. Only a small number of tiers 20 and 22 is shown, with more likely stack 18 comprising dozens, a hundred or more, etc. of tiers 20 and 22. Wordline tiers 22 comprise first material 26 (e.g., silicon nitride) which may be wholly or partially sacrificial. Insulative tiers 20 comprise second material 24 (e.g., silicon dioxide) that is of different composition from that of first material 26 and which may be wholly or partially sacrificial. In one embodiment, material 26 may be considered as first sacrificial material 26 and in one embodiment material 24 may be considered as second sacrificial material 24. Conductive material 16 may comprise part of control circuitry (e.g., peripheral-under-array circuitry) used to control read and write access to the transistors and/or memory cells that will be formed within array 12. Other circuitry that may or may not be part of peripheral and/or control circuitry (not shown) may be between conductive material 16 and stack 18. For example, multiple vertically-alternating tiers of conductive material and insulative material (not shown) of such circuitry may be below a lowest of the wordline tiers 22 and/or above an uppermost of the wordline tiers 22.

Figure 2:
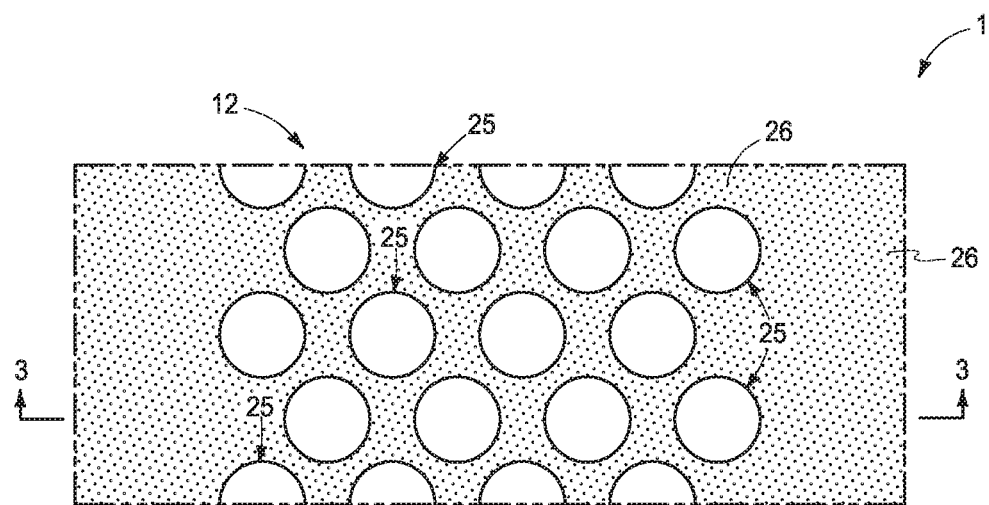
FIG. 2 is a view of the FIG. 1 substrate at a processing step subsequent to that shown by FIG. 1 and is taken through line 2-2 in FIG. 3.
Figure 3:
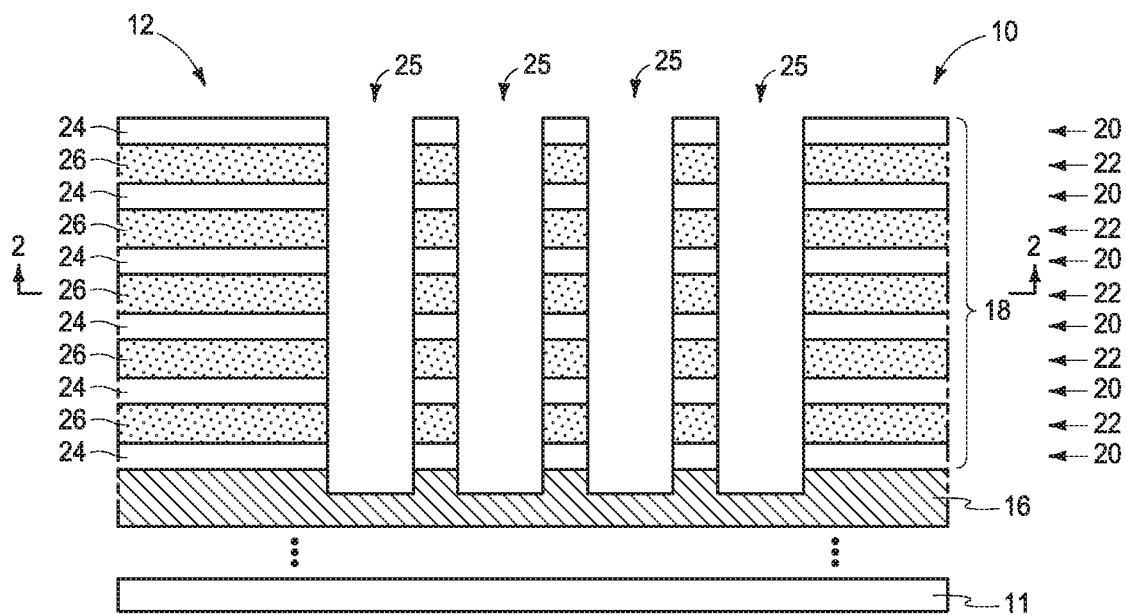
FIG. 3 is a view taken through line 3-3 in FIG. 2.

Referring to FIGS. 2 and 3, channel openings 25 have been formed (e.g., by dry anisotropic etching) into alternating tiers 20 and 22. By way of example only, channel openings 25 are shown as being arranged in groups or columns of staggered rows of four openings 25 per row. Any alternate existing or future-developed arrangement and construction may be used. Channel openings 25 may go into conductive material 16 as shown or may stop there-atop (not shown).

In one embodiment, transistor channel material is formed in the individual channel openings to extend elevationally through the insulative tiers and the wordline tiers, and individual memory cells of the array are formed to comprise a gate region (e.g., a control-gate region) and a memory structure laterally between the gate region and the channel material. In one such embodiment, the memory structure is formed to comprise a charge-blocking region, charge-storage material, and insulative charge-passage material. The charge-storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a bandgap-engineered structure having nitrogen containing material [e.g., silicon nitride] sandwiched between two insulator oxides [e.g., silicon dioxide]) is laterally between the channel material and the charge-storage material.

Figure 4:
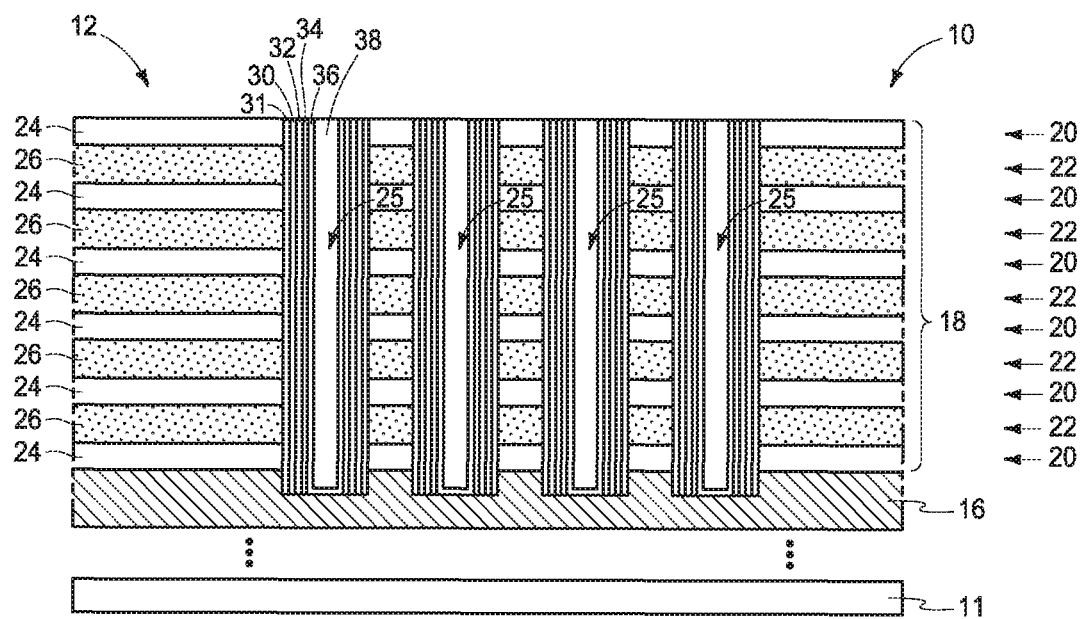
FIG. 4 is a view of the FIG. 3 substrate at a processing step subsequent to that shown by FIG. 3.

FIG. 4 shows one embodiment wherein charge-blocking material 31/30, charge-storage material 32, and charge-passage material 34 have been formed in individual channel openings 25 elevationally along insulative tiers 20 and wordline tiers 22. Transistor materials 31/30, 32 and 34 (e.g., memory cell materials) may be formed by, for example, deposition of respective thin layers thereof over stack 18 and within individual channel openings 25 followed by planarizing such back at least to an uppermost surface of stack 18. Punch etching may be conducted to remove materials 31/30, 32 and 34 from the bases of channel openings 25 to expose conductive material 16. Channel material 36 has then been formed in channel openings 25 elevationally along insulative tiers 20 and wordline tiers 22. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 are 25 to 100 Angstroms. Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 5:
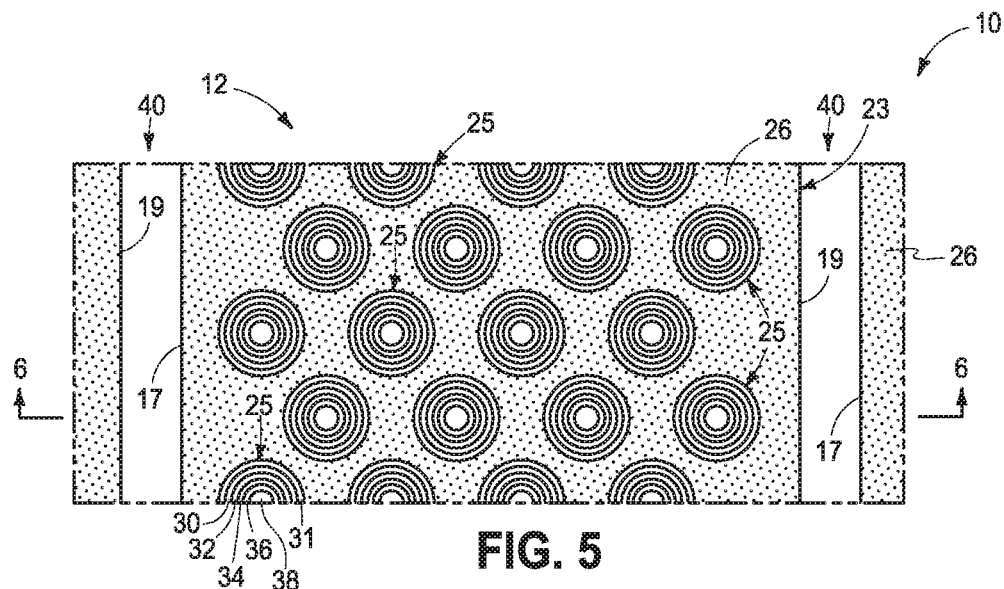
FIG. 5 is a view of the FIG. 4 substrate at a processing step subsequent to that shown by FIG. 4 and is taken through line 5-5 in FIG. 6.
Figure 6:
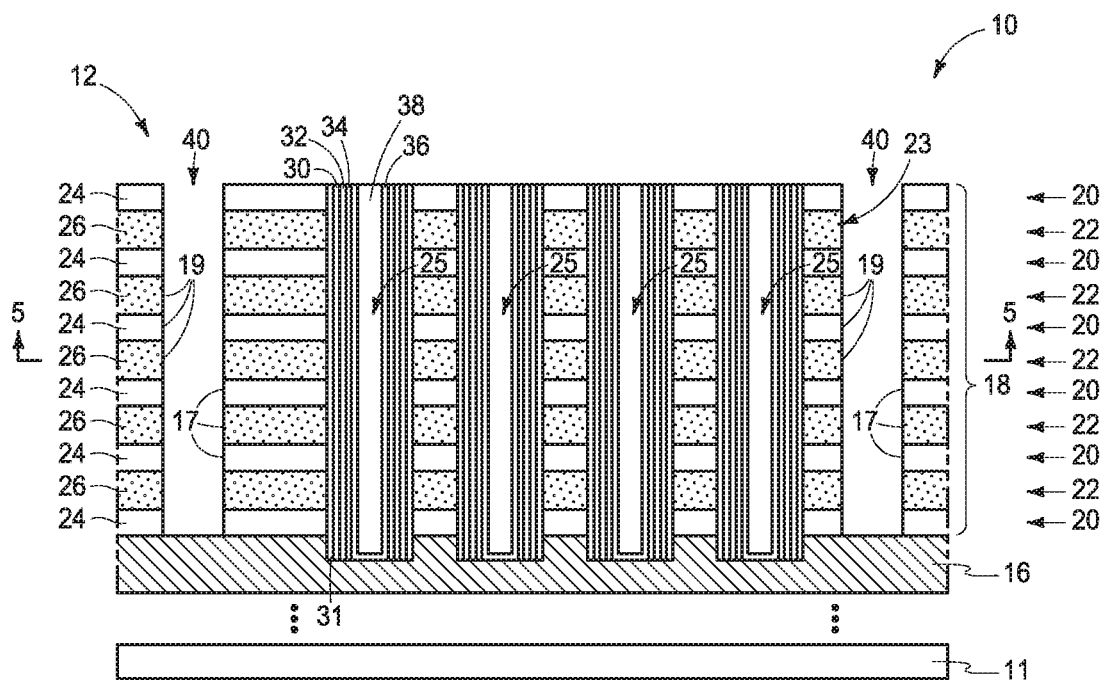
FIG. 6 is a view taken through line 6-6 in FIG. 5.

Referring to FIGS. 5 and 6, horizontally-elongated trenches 40 have been formed (e.g., by anisotropic etching) into stack 18 and in one embodiment to conductive material 16 (at least to material 16). Such, by way of example, has formed insulative tiers 20 and wordline tiers 22 to comprise opposing longitudinal edges 17, 19 (e.g., pairs of such edges) that together comprise longitudinal shape of longitudinal outlines 23 of individual wordlines to be formed in individual wordline tiers 22. Only one complete longitudinal outline 23 is shown with respect to two opposing longitudinal edges 17, 19, with only a partial longitudinal outline of two laterally-adjacent wordlines to be formed adjacent longitudinal outline 23 being visible with respect to one longitudinal edge 17 and one longitudinal edge 19. The wordlines to be formed may project laterally outward or be recessed laterally inward relative to longitudinal edges 17 and 19 as will be apparent from the continuing discussion.

Figure 7:
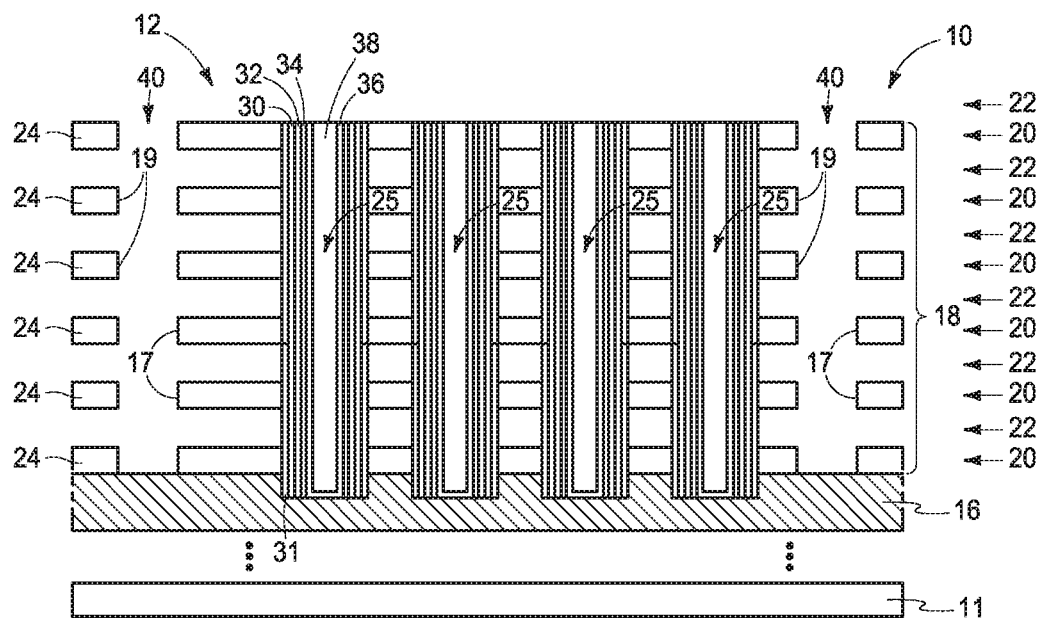
FIG. 7 is a view of the FIG. 6 substrate at a processing step subsequent to that shown by FIG. 6.

Referring to FIG. 7, first material 26 (not shown) of wordline tiers 22 has been etched selectively relative to second material 24 (e.g., using liquid or vapor $H_3PO_4$ as a primary etchant where material 26 is silicon nitride and material 24 is silicon dioxide).

Figure 8:
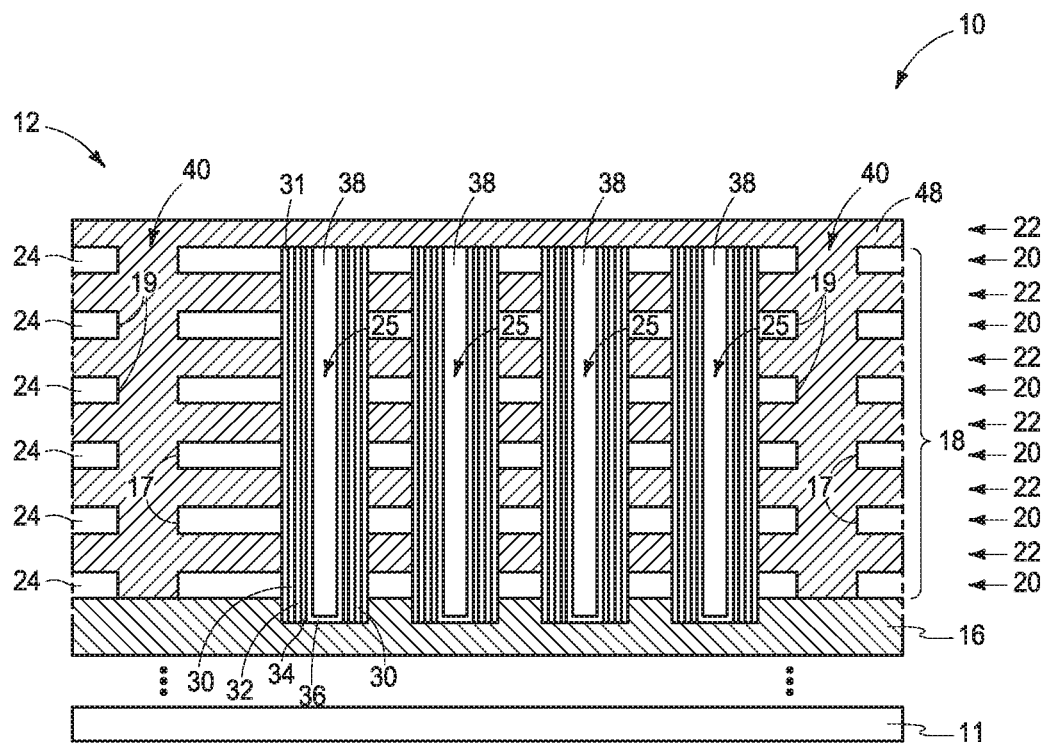
FIG. 8 is a view of the FIG. 7 substrate at a processing step subsequent to that shown by FIG. 7.

Referring to FIG. 8, conductive material 48 has been formed into wordline tiers 22 through trenches 40 and which will comprise conductive material of the individual wordlines to be formed. Any suitable conductive material may be used, for example one or both of metal material and/or conductively-doped semiconductor material.

Figure 9:
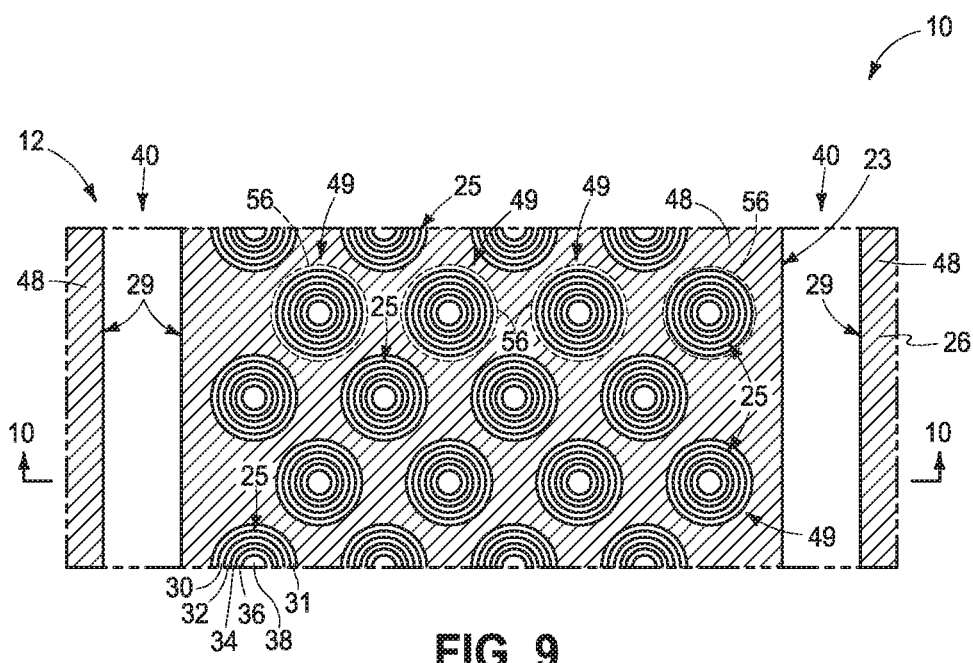
FIG. 9 is a view of the FIG. 8 substrate at a processing step subsequent to that shown by FIG. 8 and is taken through line 9-9 in FIG. 10.
Figure 10:
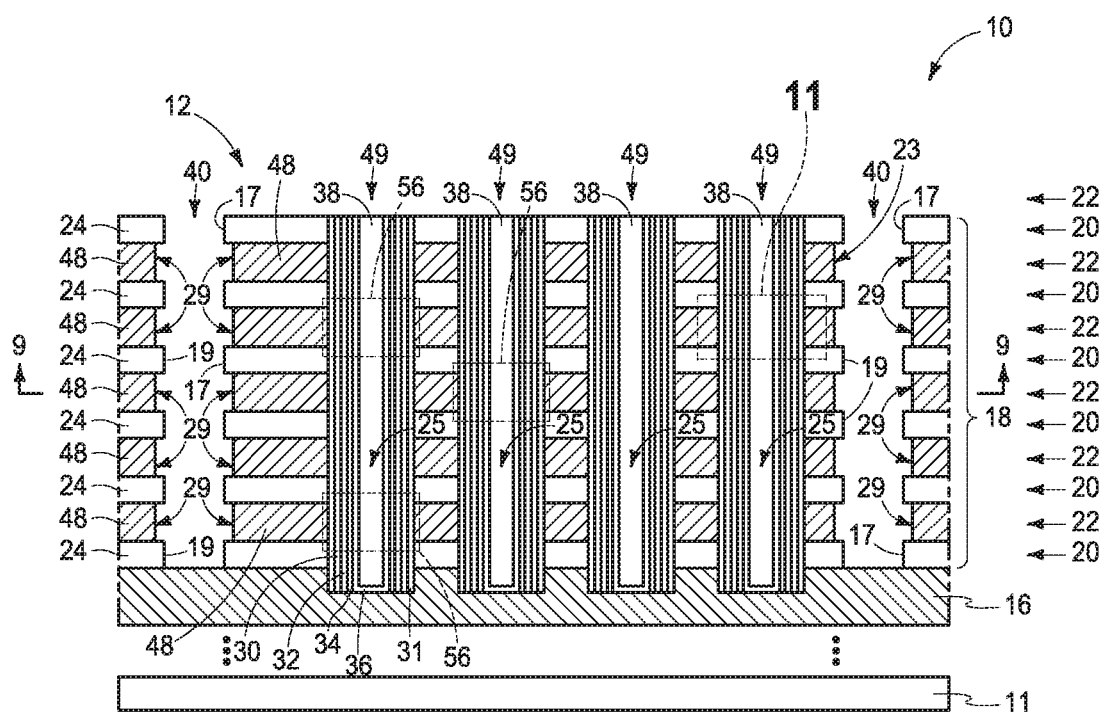
FIG. 10 is a view taken through line 10-10 in FIG. 9.
Figure 11:
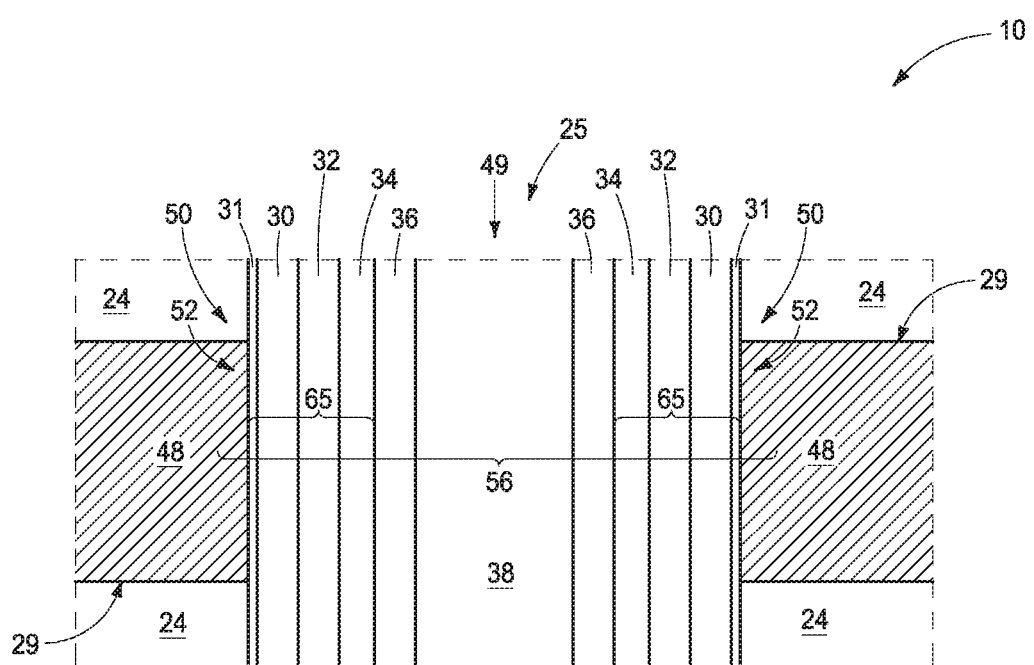
FIG. 11 is an enlarged view of a portion of FIG. 10.

Referring to FIGS. 9-11, first conductive material 48 has been removed from individual trenches 40. Such has resulted in formation of wordlines 29 and elevationally-extending strings 49 of individual transistors and/or memory cells 56. Approximate locations of transistors and/or memory cells 56 are indicated with a bracket in FIG. 11 and some with dashed outlines in FIG. 10, with transistors and/or memory cells 56 being essentially ring-like or annular in the depicted example. First conductive material 48 may be considered as having terminal ends 50 (FIG. 11) corresponding to control-gate regions 52 of individual transistors and/or memory cells 56. Control-gate regions 52 in the depicted embodiment comprise individual portions of individual wordlines 29. Materials 31/30, 32, and 34 may be considered as a memory structure 65 that is laterally between control-gate region 52 and channel material 36.

A charge-blocking region (e.g., charge-blocking material 31/30) is between charge-storage material 32 and individual control-gate regions 52. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. An example charge-blocking region as shown comprises insulator material 31/30. By way of further examples, a charge-blocking region may comprise a laterally (e.g., radially) outer portion of the charge-storage material (e.g., material 32) where such charge-storage material is insulative (e.g., in the absence of any different-composition material between an insulative charge-storage material 32 and conductive material 48). Regardless, as an additional example, an interface of a charge-storage material and conductive material of a control gate may be sufficient to function as a charge-blocking region in the absence of any separate-composition-insulator material 31/30. Further, an interface of conductive material 48 with material 31/30 (when present) in combination with insulator material 31/30 may together function as a charge-blocking region, and as alternately or additionally may a laterally-outer region of an insulative charge-storage material (e.g., a silicon nitride material 32). An example material 31 is any silicon hafnium oxide and an example material 30 is silicon dioxide and/or silicon nitride.

Figure 12:
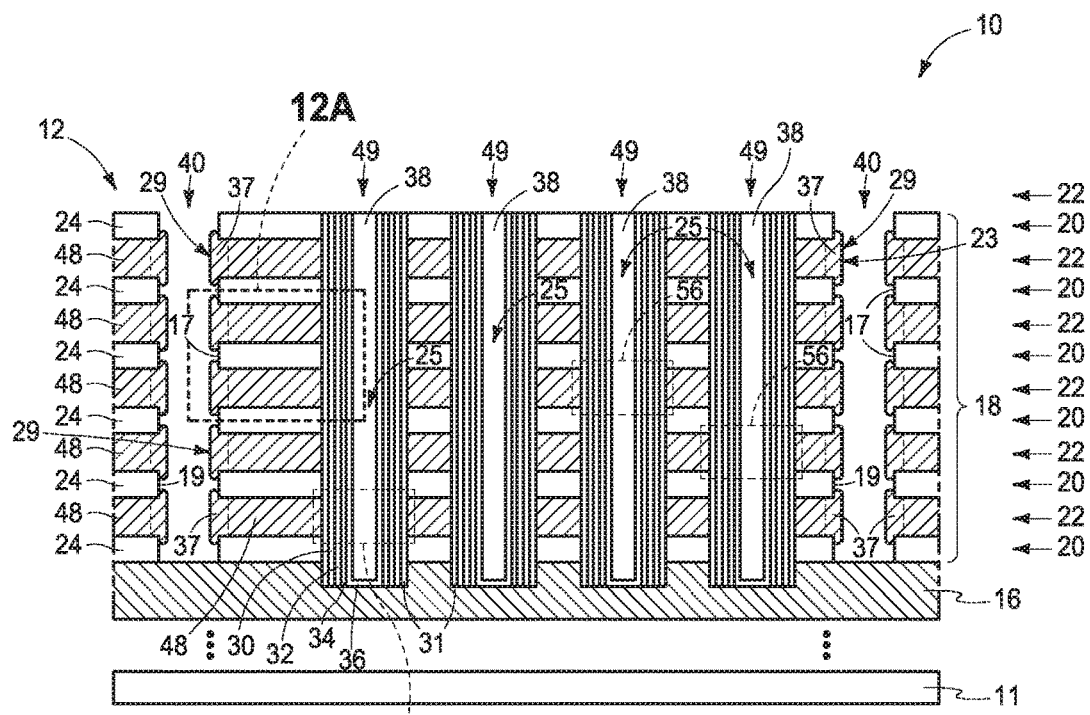
FIG. 12 is a view of the FIG. 10 substrate at a processing step subsequent to that shown by FIG. 10.
Figure 12A:
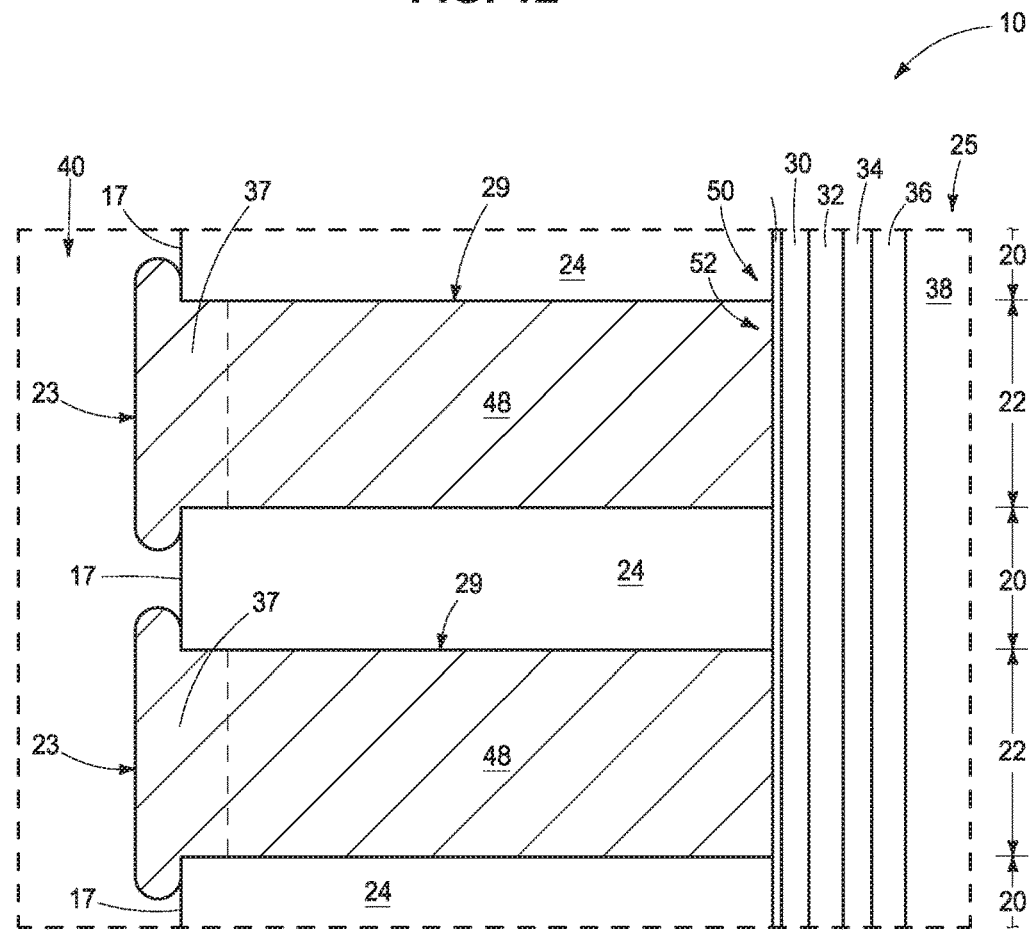
FIG. 12A is an enlarged view of a portion of FIG. 12.

Referring to FIGS. 12 and 12A, second conductive material 37 has been selectively deposited (i.e., selectively relative to other outwardly exposed material) laterally beyond opposing longitudinal edges 17, 19 of insulative tiers 20 and whereby second conductive material 37 projects upwardly and downwardly into individual adjacent insulative tiers 20 and comprises part of individual wordlines 29. First conductive material 48 and second conductive material 37 may be of the same composition or of different compositions relative one another. In one embodiment and as shown, first conductive material 48 is laterally recessed from opposing longitudinal edges 17, 19 of insulative tiers 20 (FIG. 10) at the start of the selectively depositing of second conductive material 37. Any existing or future-developed selective depositions/growing techniques may be used. As but one example where conductive materials 48 and 37 comprise elemental tungsten and/or aluminum and other exposed materials comprise silicon dioxide and/or silicon nitride, an example technique is that disclosed in U.S. Pat. No. 5,043,299, to Chang et al., that issued on Aug. 27, 1991.

Figure 13:
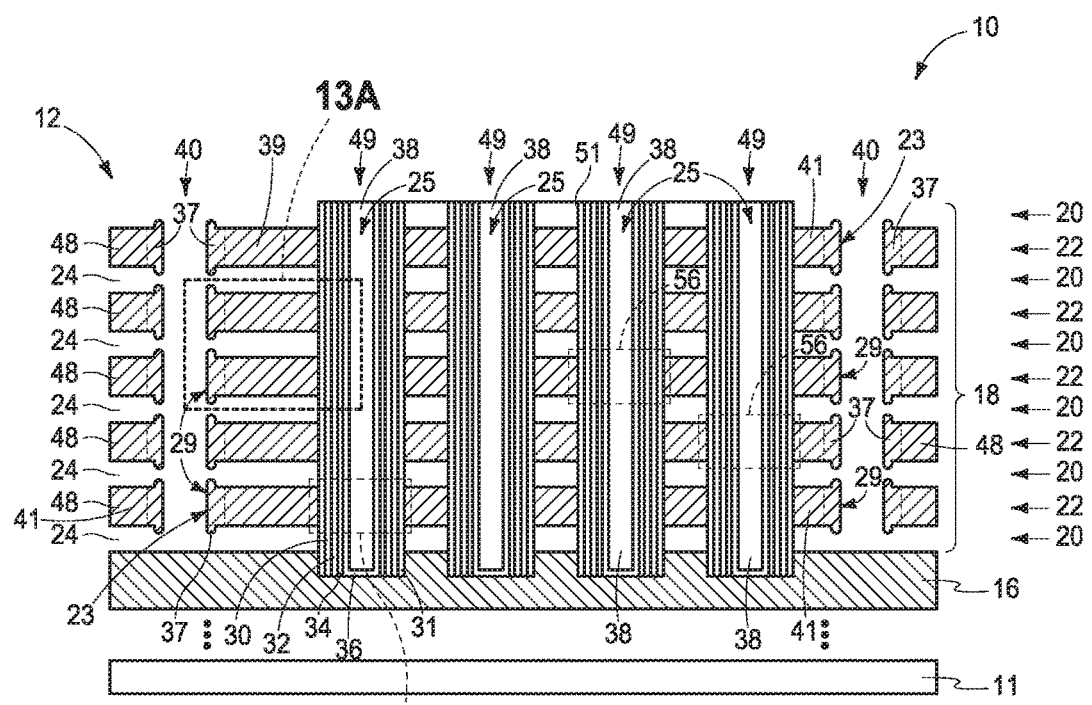
FIG. 13 is a view of the FIG. 12 substrate at a processing step subsequent to that shown by FIG. 12.
Figure 13A:
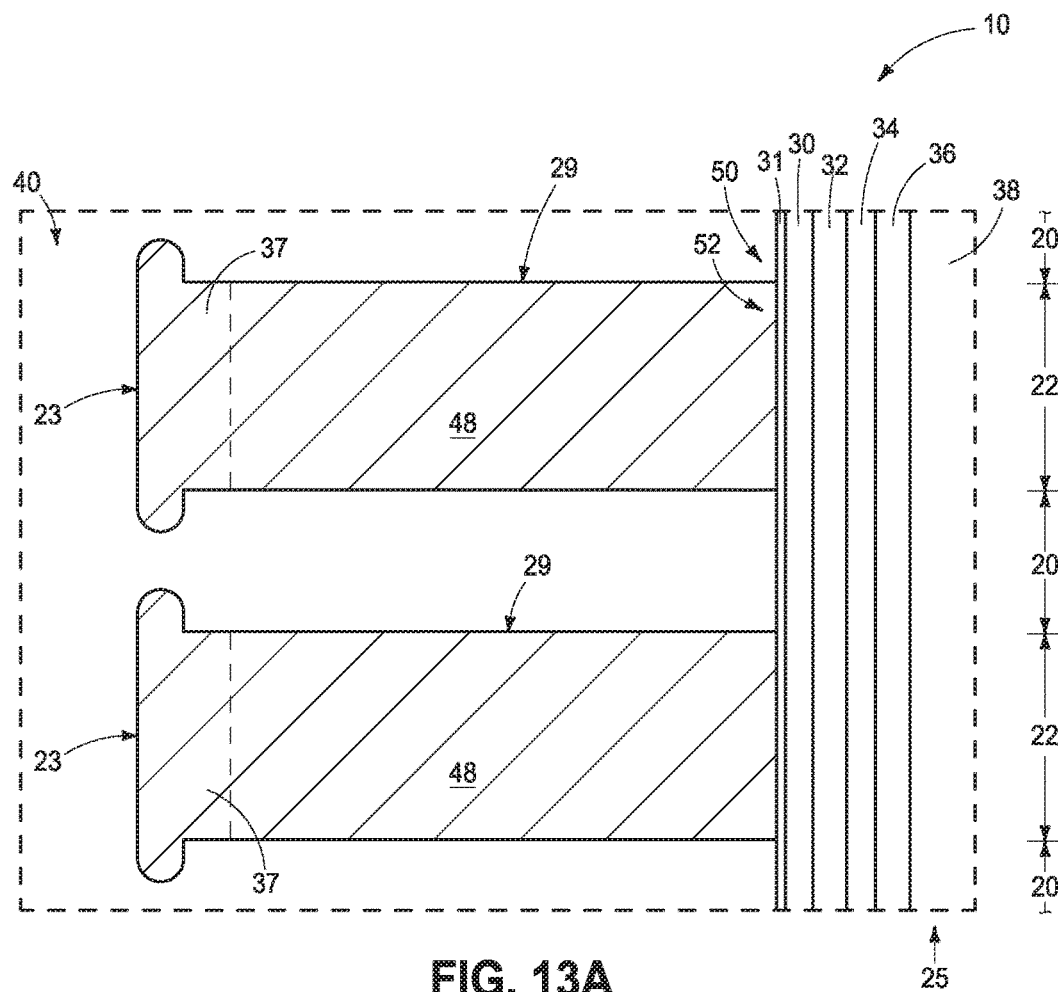
FIG. 13A is an enlarged view of a portion of FIG. 13.

In one embodiment where insulative tiers at least initially comprise a sacrificial material (e.g., material 24, and regardless of whether being insulative, semiconductive, or conductive), an embodiment of the invention further comprises removing such sacrificial material after the act of selectively depositing shown by FIGS. 12 and 12A. Such by way of example only is shown in FIGS. 13 and 13A wherein all sacrificial material 24 (not shown) has been removed, for example by wet isotropic selective etching relative to other exposed materials. Where, for example, material 24 comprises silicon dioxide, materials 37 and 38 comprise elemental tungsten, and material 31 comprises a silicon hafnium oxide, an example wet etching chemistry is liquid or vapor HF.

Figure 14:
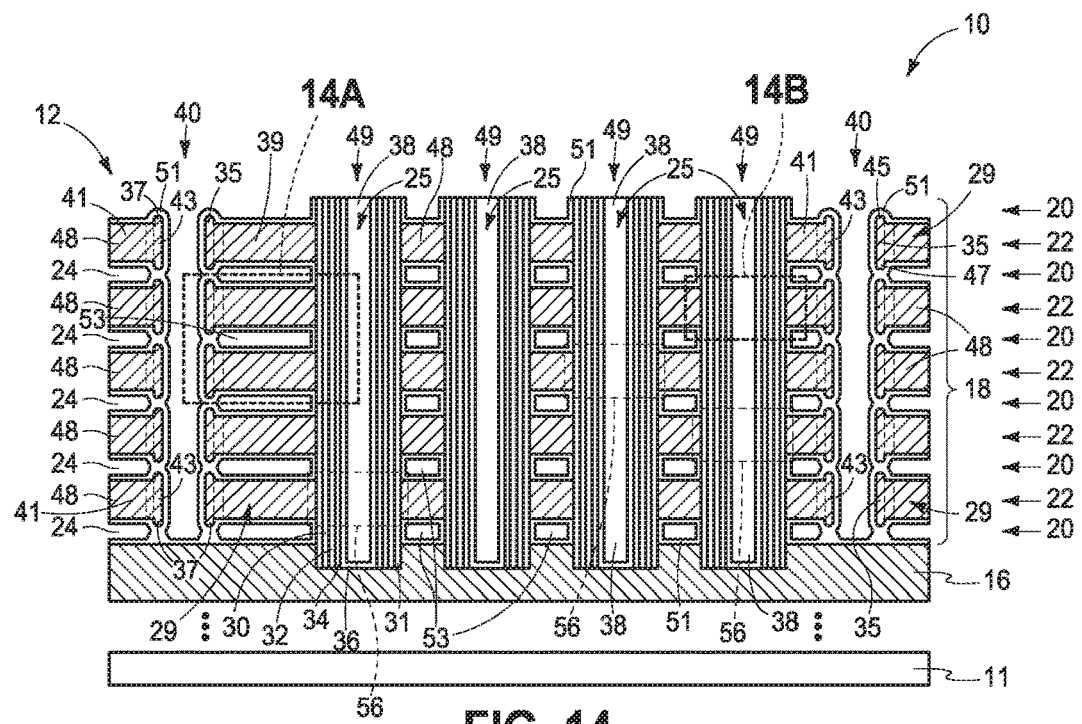
FIG. 14 is a view of the FIG. 13 substrate at a processing step subsequent to that shown by FIG. 13.
Figure 14A:
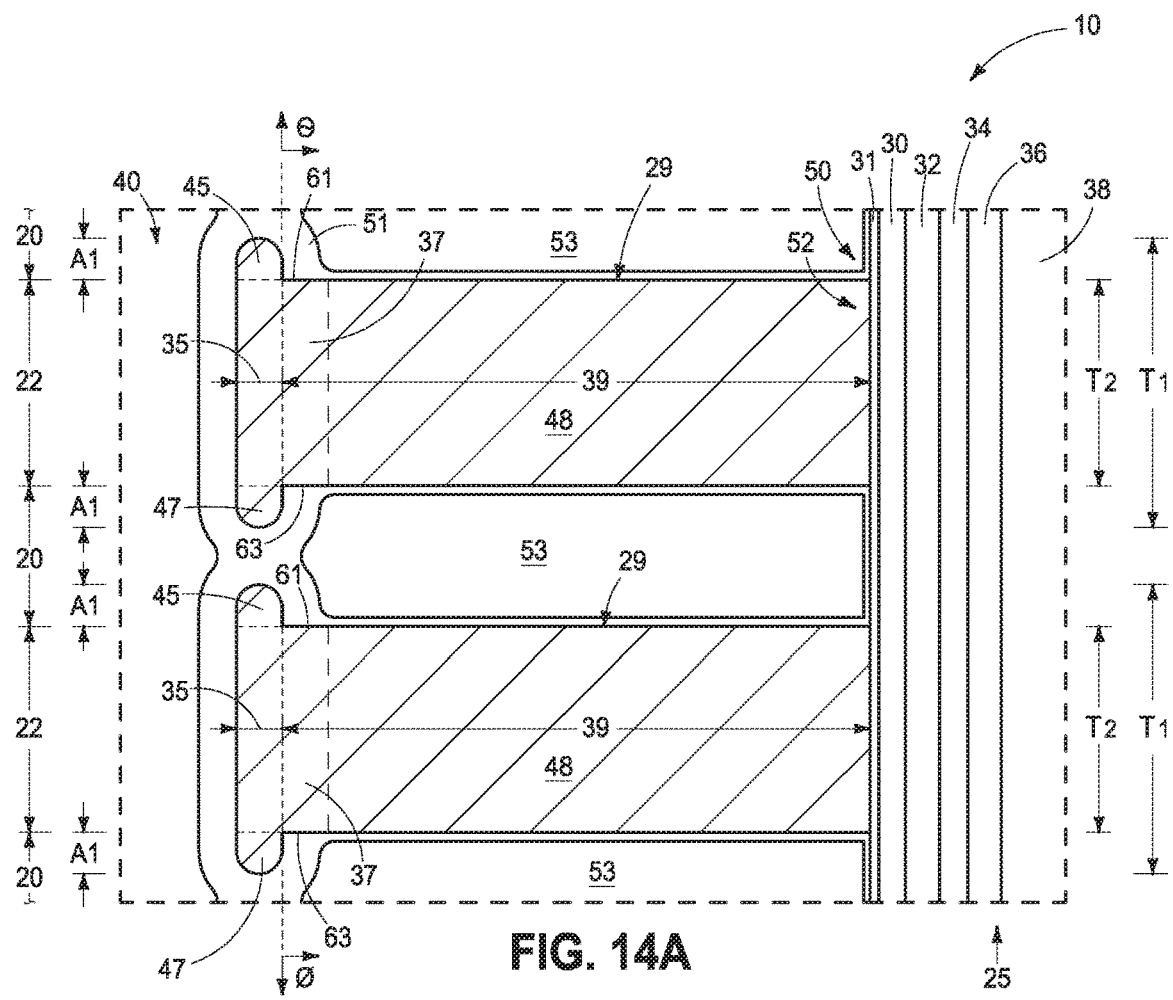
FIG. 14A is an enlarged view of a portion of FIG. 14.
Figure 14B:
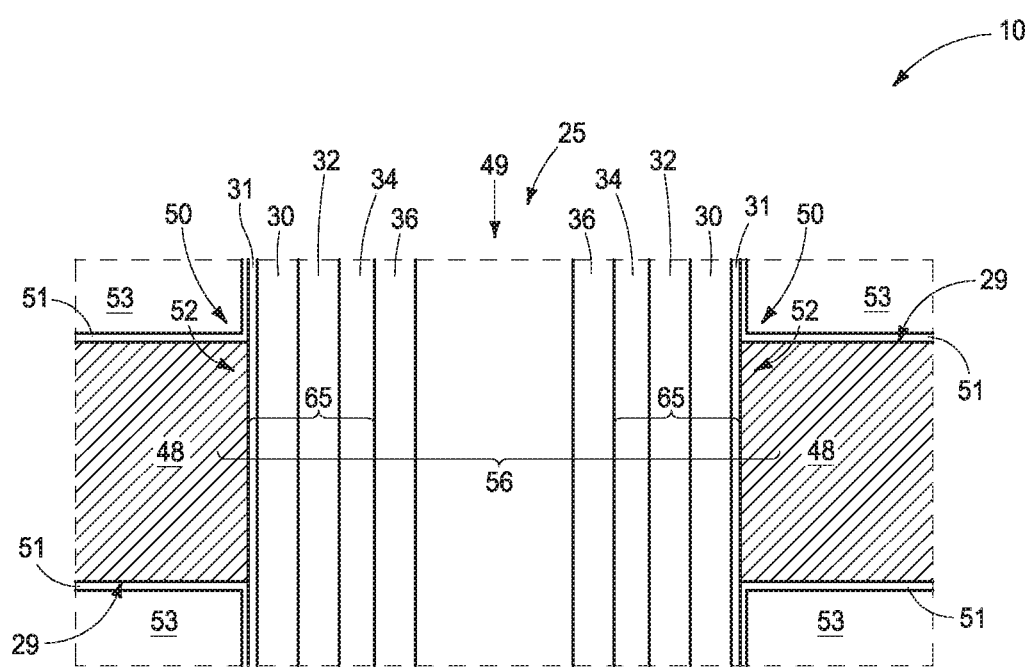
FIG. 14B is an enlarged view of a portion of FIG. 14.

Referring to FIGS. 14, 14A, and 14B, insulator material 51 (e.g., silicon nitride, silicon oxynitride, aluminum oxide, hafnium oxide, combinations of these, etc.) has been formed to extend elevationally completely between the upwardly and downwardly projecting portions of the selectively-deposited second conductive material 37 of immediately-vertically-adjacent wordline tiers 22. In one such embodiment and as shown, such forms longitudinally-elongated voids 53 (running into and out of the plane of the page upon which FIGS. 14, 14A, and 14B lie) in individual insulative tiers 20.

Figure 15:
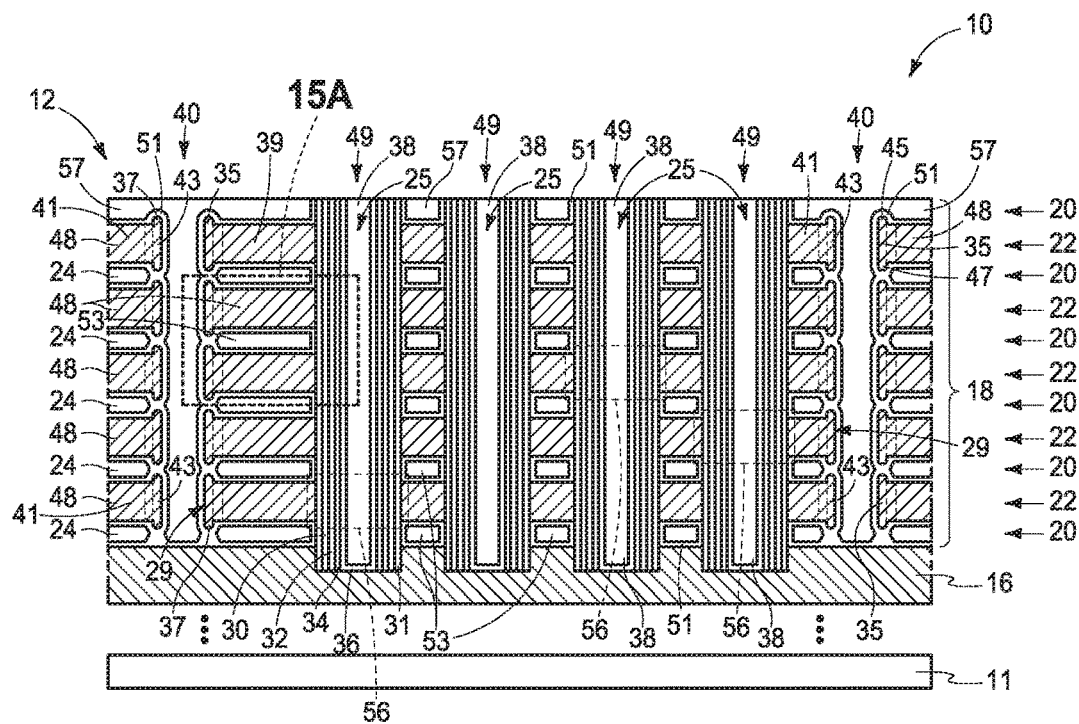
FIG. 15 is a view of the FIG. 14 substrate at a processing step subsequent to that shown by FIG. 14.
Figure 15A:
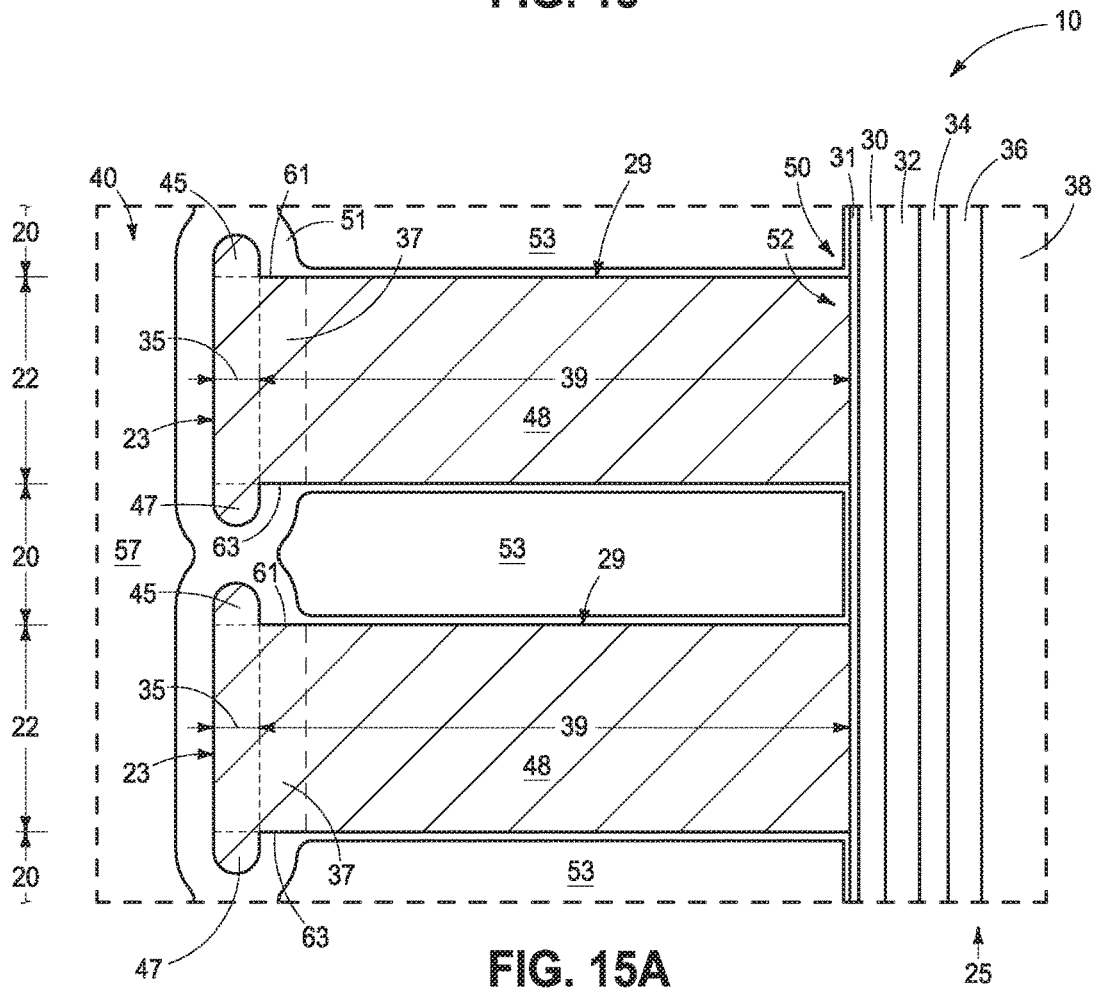
FIG. 15A is an enlarged view of a portion of FIG. 15.

Referring to FIGS. 15 and 15A, another material 57 (dielectric and/or silicon-containing such as polysilicon) has been formed in individual trenches 40 elevationally along and spanning laterally between insulator material 51 therein.

Referring to FIGS. 14, 14A, 15, and 15A, the example formed individual wordlines 29 may be considered as comprising laterally-outer longitudinal-edge portions 35 and 43 and a respective laterally-inner portion 39 or 41 laterally adjacent individual laterally-outer longitudinal-edge portions 35, 43, with individual laterally-outer longitudinal-edge portions 35 and 43 projecting upwardly and downwardly relative to its laterally-adjacent laterally-inner portion 39 or 41. In one embodiment, insulator material 51 extends elevationally completely between individual laterally-outer longitudinal-edge portions 35 and 43 of immediately-vertically-adjacent wordline tiers 22. In one embodiment where longitudinally-elongated voids 53 are formed, such may be laterally circumferentially surrounded by insulator material 51 as shown. In one embodiment, individual laterally-outer longitudinal-edge portions 35 and 43 may be considered as comprising an up-projection 45 projecting upwardly at an angle θ (FIG. 14A) from an immediately-laterally-adjacent upper surface 61 and a down-projection 47 projecting downwardly at an angle θ from an immediately-laterally-adjacent lower surface 63. In one such embodiment, each of angles Θ and Φ is 90° and in one embodiment each of immediately-laterally-adjacent upper and lower surfaces 61 and 63, respectively, is horizontal. In one embodiment, up-projection 45 and down-projection 47 project the same maximum amount (an amount A1) from their respective immediately-laterally-adjacent upper and lower surface 61 or 63, respectively. In one embodiment, individual of laterally-outer longitudinal-edge portions 35 and 43 are taller (dimension T1) than individual of laterally-inner portions 39 or 41 (dimension T2).

Figure 16:
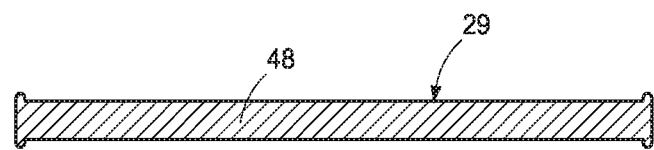
FIG. 16 is a diagrammatic and redacted sectional view of a portion of the FIG. 15 substrate.

In one embodiment, individual wordlines 29 are of a generally horizontal I-beam shape in vertical cross-section orthogonal to a primary longitudinal orientation (i.e., direction) of individual wordlines 29. FIG. 16 shows such an example I-beam shape of an individual wordline 29 wherein the channel openings and material therein are not shown for clarity in perceiving the general I-beam shape.

Any other attribute(s) or aspect(s) as shown and/or described herein with respect to other embodiments may be used with respect to the above-described embodiments.

An alternate example method used in forming a memory array 12 is next described with reference to FIG. 17-23 (including FIG. 17A). Like numerals from the above-described embodiments have been used where appropriate, with some construction differences being indicated with the suffix "a" or with different numerals.

Figure 17:
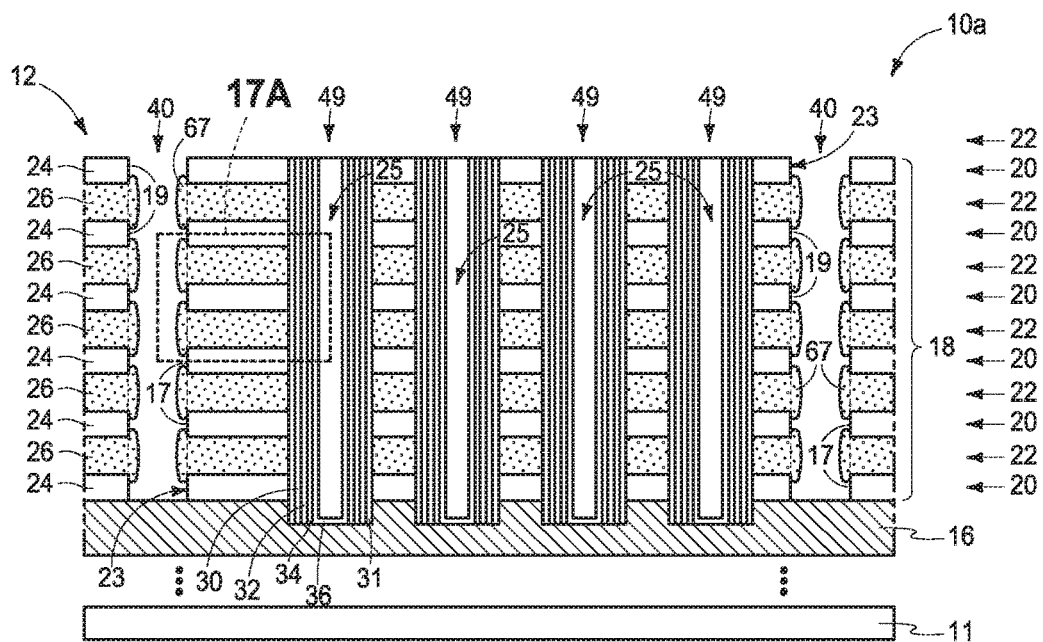
FIG. 17 is a diagrammatic cross-sectional view of a portion of a substrate in process in accordance with an embodiment of the invention.
Figure 17A:
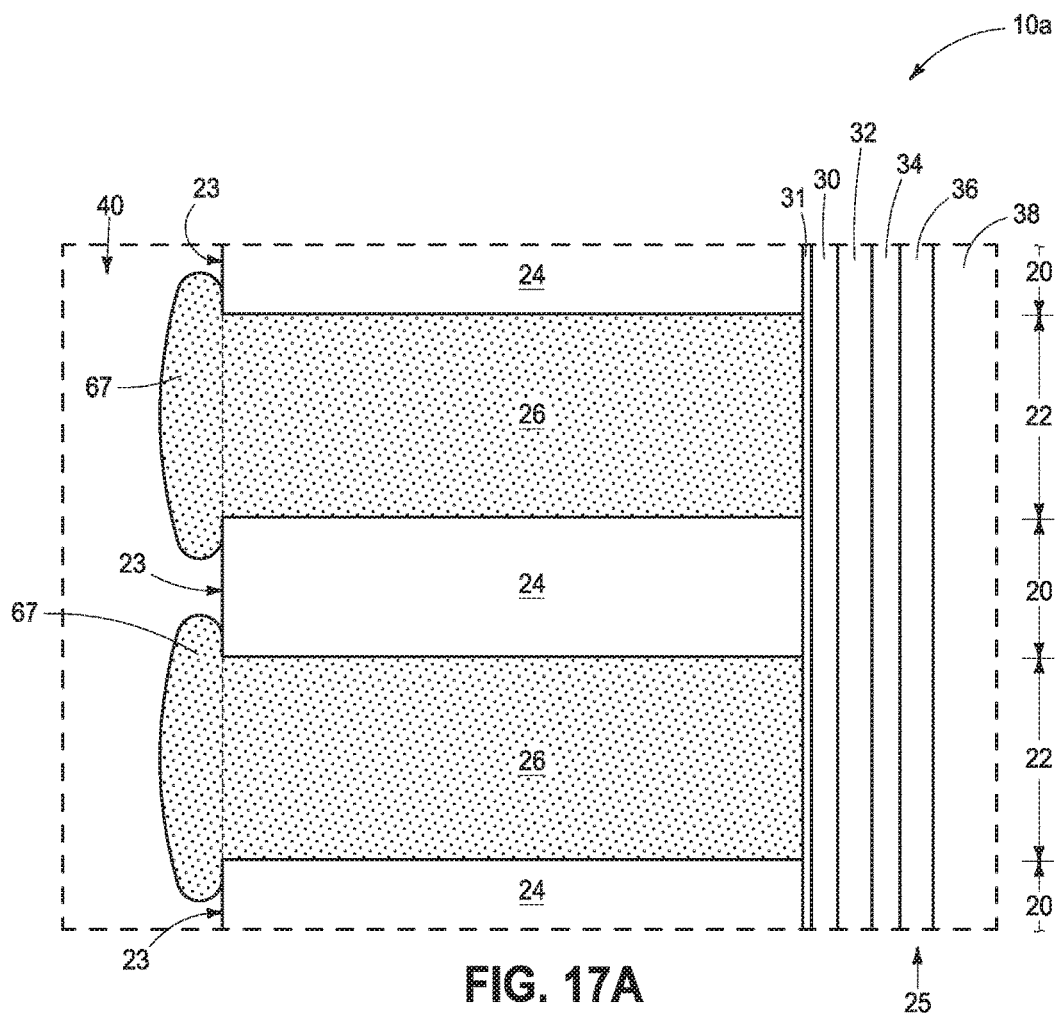
FIG. 17A is an enlarged view of a portion of FIG. 17.

Referring to FIGS. 17 and 17A, such show example alternate processing to that depicted by FIG. 7. In such embodiment, materials 26 and 24 of FIG. 6 may be considered as comprising a first sacrificial material 26 and a second material 24 (e.g., that may be sacrificial) of different composition from that of first sacrificial material 26. A third sacrificial material 67 has been selectively deposited from first sacrificial material 26 (i.e., selectively relative to other outwardly exposed material) laterally beyond opposing longitudinal edges 17, 19 of insulative tiers 20 and to project upwardly and downwardly into individual adjacent insulative tiers 20. Third sacrificial material 67 is of different composition from that of second material 24. First sacrificial material 26 and third sacrificial material 67 may be of the same composition or of different compositions relative one another. As an example, and by way of example only where materials 26 and 67 are silicon nitride and second material 24 is silicon dioxide, silicon nitride material 67 can be selectively grown from silicon nitride material 26 by initially causing the silicon dioxide to be hydroxyl terminated (e.g., by exposure to $H_2$ plasma or water). This is followed by exposure of the substrate to $Si(CH_3)_3N(CH_3)_2$ that selectively forms $(CH_3)_3SiO$ bonded to the silicon dioxide, and that will block silicon nitride from subsequently being deposited thereon. Thereby, silicon nitride deposited by any existing or future-developed manner will effectively selectively deposit on exposed silicon nitride.

Figure 18:
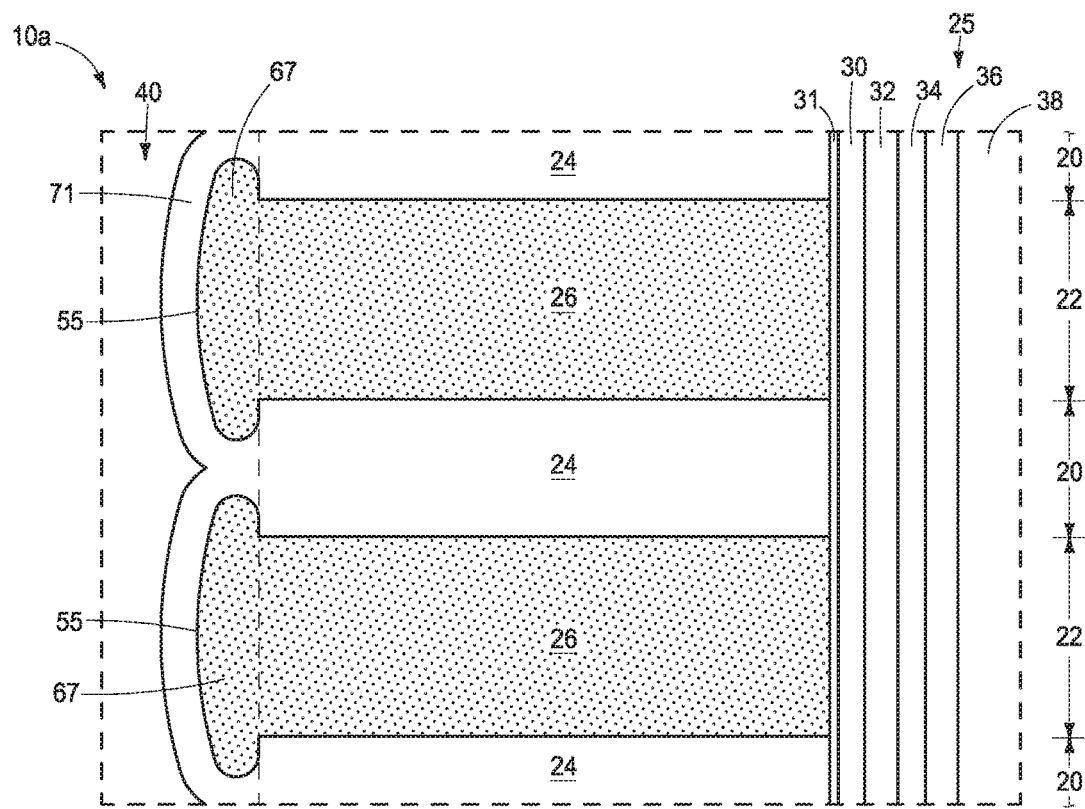
FIG. 18 is a view of the FIG. 17A substrate at a processing step subsequent to that shown by FIG. 17A.

Referring to FIG. 18, a fourth material 71 that is of different composition from those of first sacrificial material 26 and third sacrificial material 67 has been formed directly above and directly below selectively-deposited third sacrificial material 67 that projects upwardly and downwardly, respectively, into individual insulative tiers 20. In one embodiment, fourth material 71 is sacrificial. Regardless, FIG. 18 also in one embodiment shows fourth material 71 as having been formed laterally over longitudinal edges 55 of third sacrificial material 67 within trenches 40.

Figure 19:
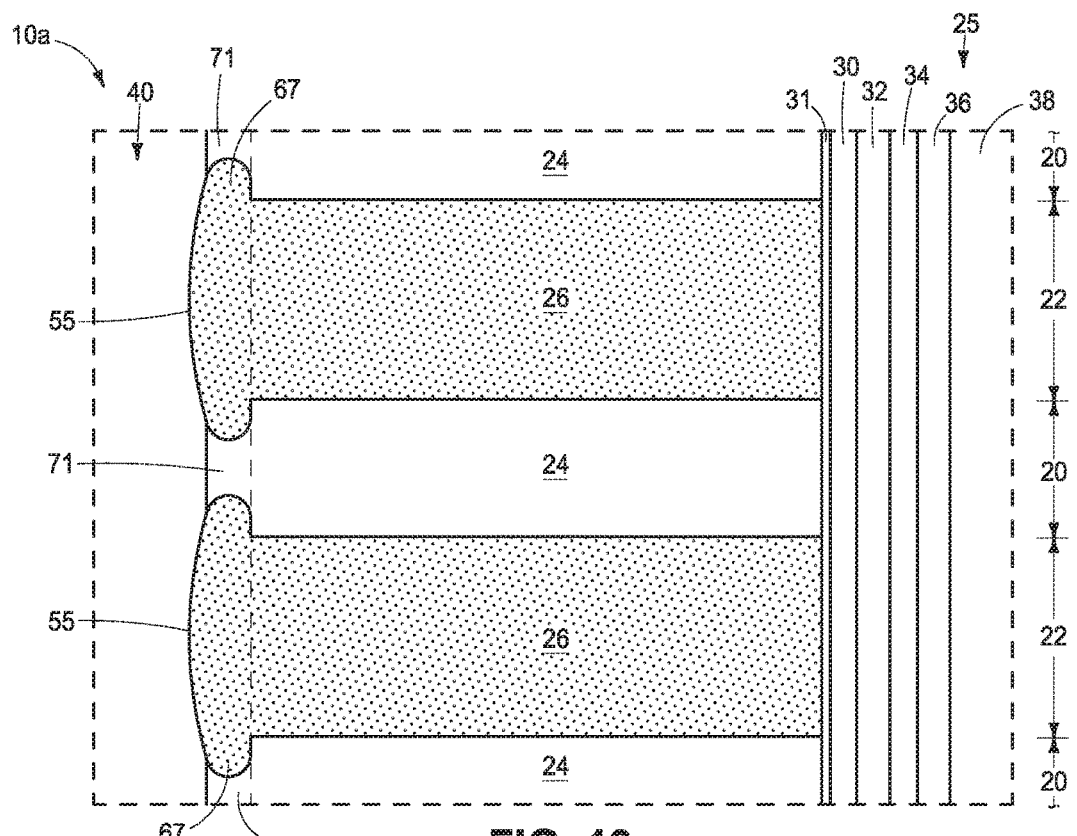
FIG. 19 is a view of the FIG. 18 substrate at a processing step subsequent to that shown by FIG. 18.

FIG. 19 shows removal of fourth material 71 from being over longitudinal edges 55, for example by a short-timed isotropic etch conducted selectively relative to third sacrificial material 67 using HF where material 71 is silicon dioxide and third sacrificial material 67 is silicon nitride.

Figure 20:
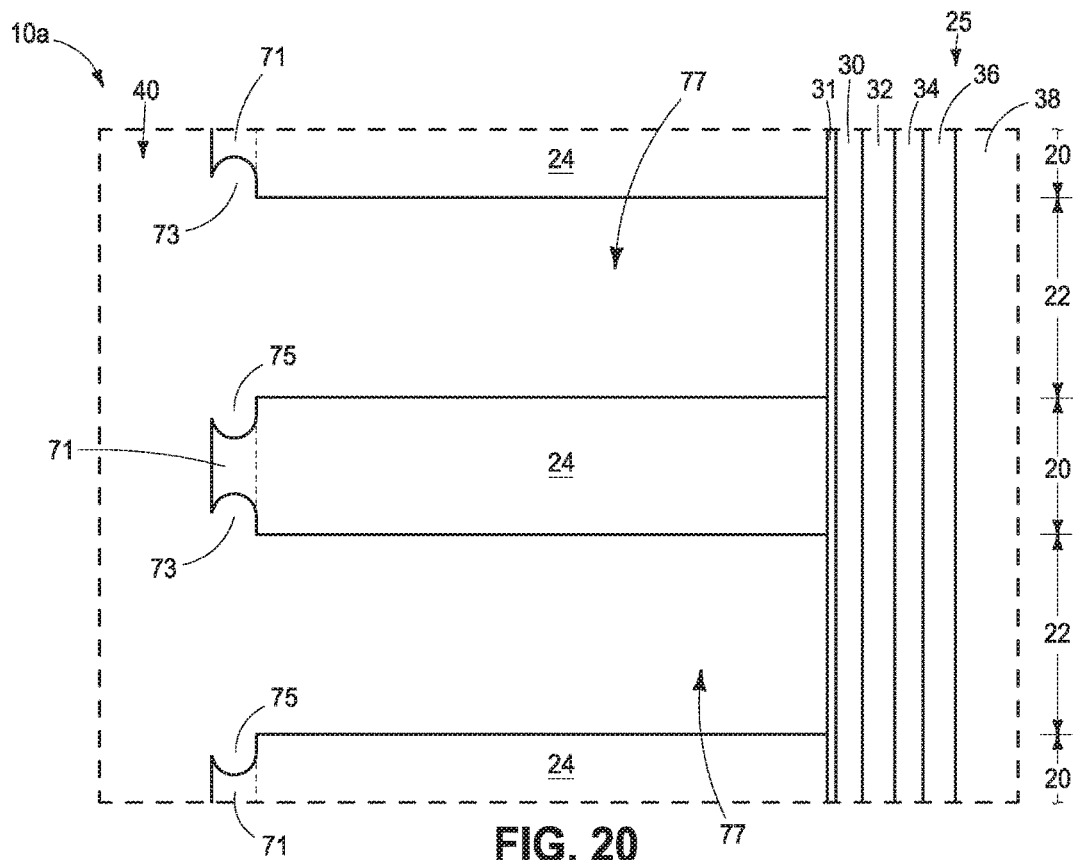
FIG. 20 is a view of the FIG. 19 substrate at a processing step subsequent to that shown by FIG. 19.

Referring to FIG. 20, first sacrificial material 26 (not shown) and third sacrificial material 67 (not shown) have been removed (e.g., by wet isotropic etching) selectively relative to second material 24 and fourth material 71 to form: a) an upwardly extending cavity 73 and a downwardly extending cavity 75 in fourth material 71, and b) a wordline tier void 77.

Figure 21:
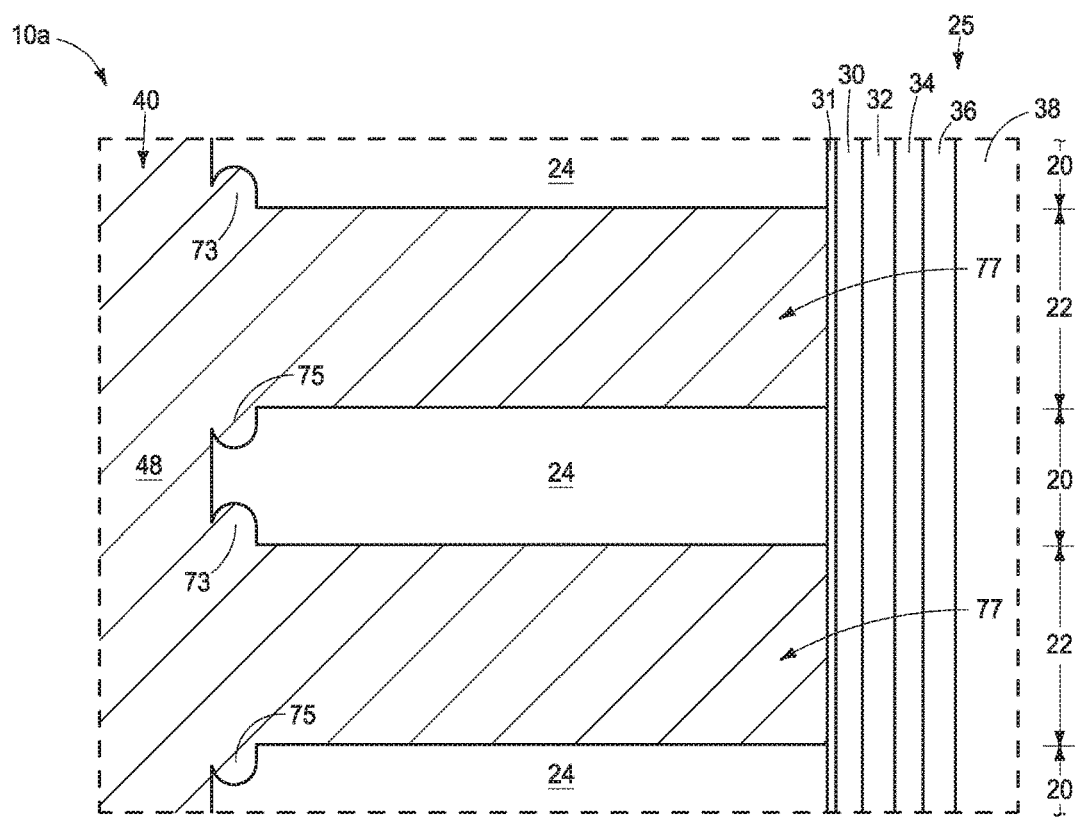
FIG. 21 is a view of the FIG. 20 substrate at a processing step subsequent to that shown by FIG. 20.

Referring to FIG. 21, first conductive material 48 has been formed in cavities 73, 75 and in wordline tier void 77. In one embodiment and as shown, first conductive material 48 completely fills cavities 73, 75 and wordline-tier void 77.

Figure 22:
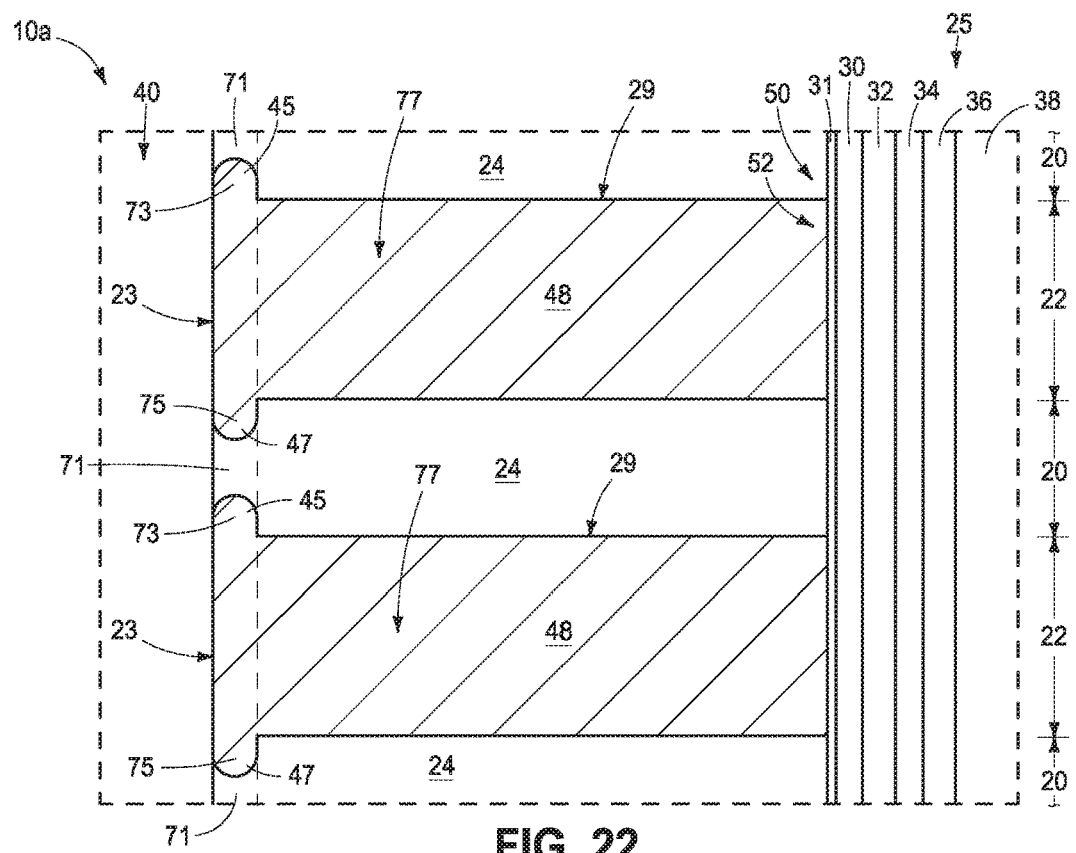
FIG. 22 is a view of the FIG. 21 substrate at a processing step subsequent to that shown by FIG. 21.

Referring to FIG. 22, first conductive material 48 has been removed from trenches 40 and thereby form individual wordlines 29 which comprise first conductive material 48 that is in cavities 73 and 75 and that is in wordline-tier voids 77.

Figure 23:
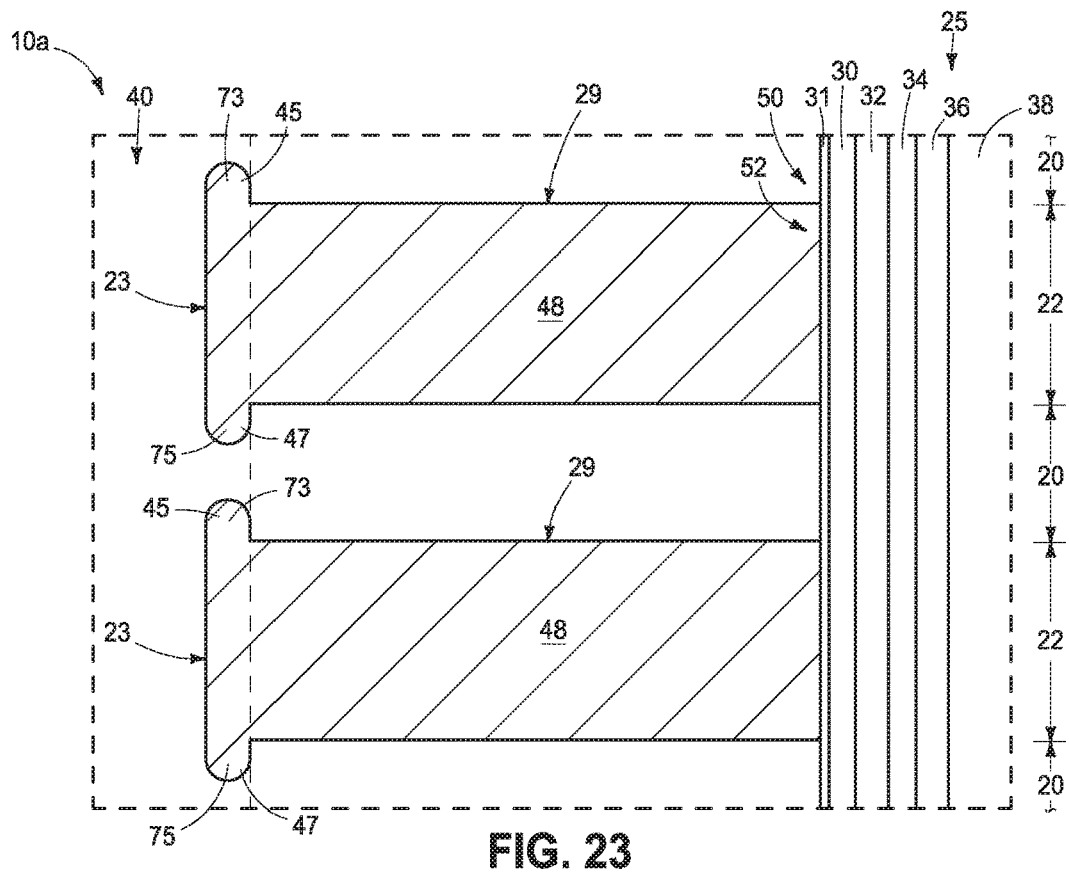
FIG. 23 is a view of the FIG. 22 substrate at a processing step subsequent to that shown by FIG. 22.

Referring to FIG. 23, and in one embodiment, after first conductive material 48 has been formed, second material 24 (not shown) and fourth material 71 (not shown) have been removed (e.g., by wet isotropic etching) selectively relative to first conductive material 48. Any other attribute(s) or aspect(s) as shown and/or described herein with respect to other embodiments may be used.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

In one embodiment, a memory array (e.g., 12) independent of method of manufacture comprises a vertical stack (e.g., 18) of alternating insulative tiers (e.g., 20) and wordline tiers (e.g., 22). The wordline tiers comprise gate regions (e.g., 52) of individual memory cells (e.g., 56). The gate regions individually comprise part of a wordline (e.g., 29) in individual of the wordline tiers. Channel material (e.g., 36) extends elevationally through the insulative tiers and the wordline tiers. The individual memory cells comprise a memory structure (e.g., 65) laterally between the gate region and the channel material. In one embodiment, individual of the wordlines comprise laterally-outer longitudinal-edge portions (e.g., 35 and 43) and a respective laterally-inner portion (e.g., 39 or 41) laterally adjacent individual of the laterally-outer longitudinal-edge portions. The individual laterally-outer longitudinal-edge portions project upwardly and downwardly relative to its laterally-adjacent laterally-inner portion. In one embodiment, individual of the laterally-outer longitudinal-edge portions are taller (e.g., T1) than individual of the laterally-inner portions (e.g., T2). Any other attribute(s) or aspect(s) as shown and/or described herein with respect to other embodiments may be used.

Figure 24:
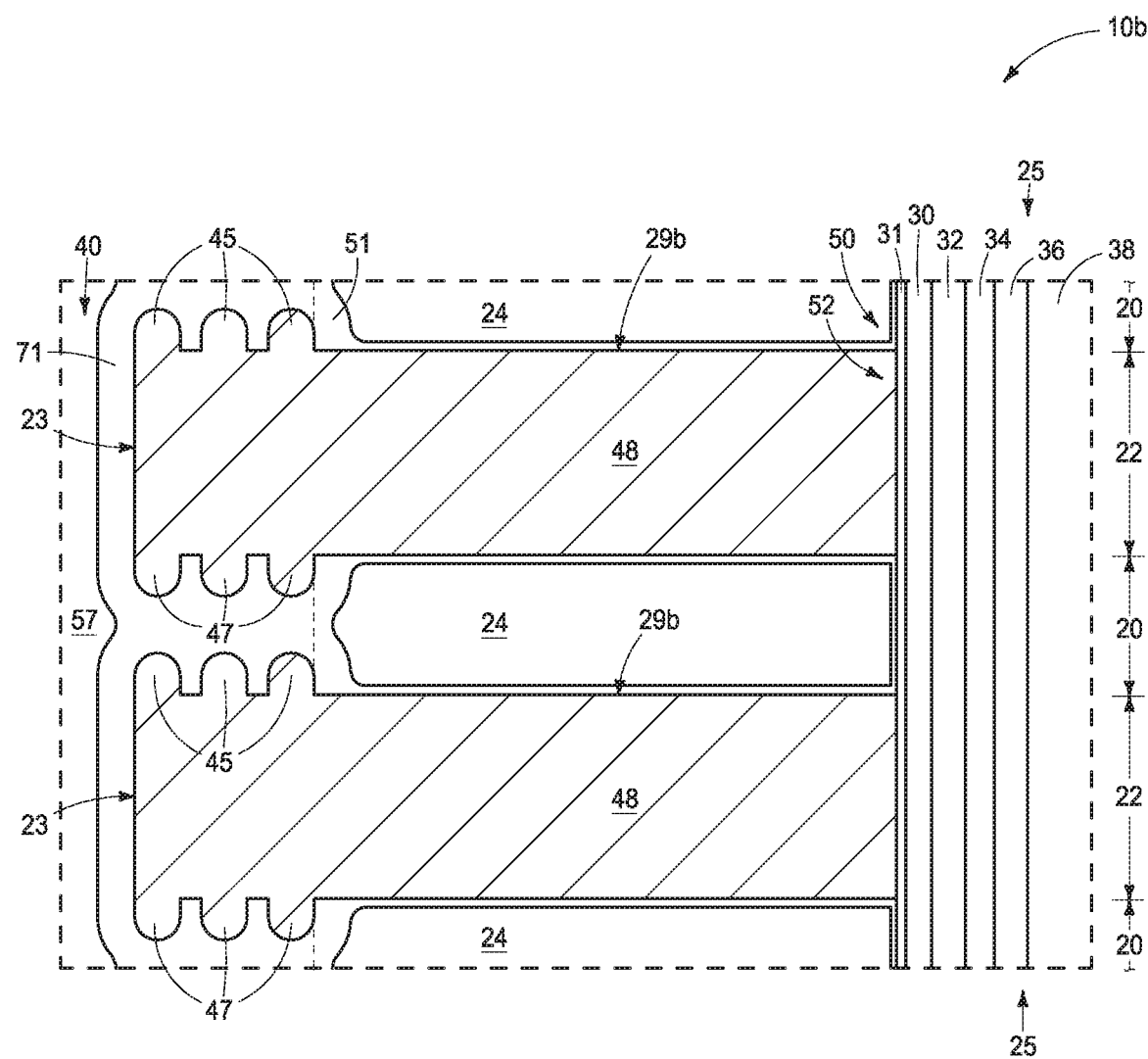
FIG. 24 is a diagrammatic cross-sectional view of a portion of a substrate in accordance with an embodiment of the invention.

The above described embodiments show example methods of producing, and structures having, one and only one up-projection 45 and one and only down-projection 47. An alternate example embodiment is described with reference to FIG. 24. Like numerals from the above-described embodiments have been used where appropriate, with some construction differences being indicated with the suffix "b". Construction 10b has multiple up-projections 45 and multiple down-projections 47. Regardless, in one embodiment, the total number of up-projections and the total number of down-projections are the same as one another (e.g., even if such totals are only 1). The embodiment of FIG. 24 may be formed, for example, by doing multiple iterations of selective depositing and fourth-material formations as was shown by FIGS. 17, 17A, 18, and 19.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprises forming a stack comprising vertically-alternating insulative tiers and wordline tiers. The insulative tiers comprise opposing longitudinal edges comprising longitudinal shape of longitudinal outlines of individual wordlines to be formed in individual of the wordline tiers. The wordline tiers comprise a first conductive material of the individual wordlines to be formed. A second conductive material is selectively deposited from the first conductive material laterally beyond the opposing longitudinal edges of the insulative tiers. The selectively-deposited second conductive material projects upwardly and downwardly into individual of the insulative tiers and comprises part of the individual wordlines.

In some embodiments, a method used in forming a memory array comprises forming a stack comprising vertically-alternating insulative tiers and wordline tiers. The insulative tiers and the wordline tiers comprise opposing longitudinal edges comprising longitudinal shape of longitudinal outlines of individual wordlines to be formed in individual of the wordline tiers. The wordline tiers comprise a first sacrificial material. The insulative tiers comprising a second material of different composition from that of the first sacrificial material. A third sacrificial material is selectively deposited from the first sacrificial material laterally beyond the opposing longitudinal edges of the insulative tiers. The selectively-deposited third sacrificial material projects upwardly and downwardly into individual of the insulative tiers. The third sacrificial material is of different composition from that of the second material. A fourth material is formed directly above and directly below the selectively-deposited third sacrificial material that projects upwardly and downwardly, respectively, into the individual insulative tiers. The fourth material is of different composition from those of the first and third sacrificial materials. The first and third sacrificial materials are removed selectively relative to the second and fourth materials to form: a) upwardly and downwardly extending cavities in the fourth material, and b) wordline-tier voids. Conductive material is formed in the cavities and in the wordline-tier voids and the individual wordlines are formed to comprise the conductive material that is in the cavities and that is in the wordline-tier voids.

In some embodiments, a memory array comprises a vertical stack comprising alternating insulative tiers and wordline tiers. The wordline tiers comprise gate regions of individual memory cells. The gate regions individually comprise part of a wordline in individual of the wordline tiers. Channel material extends elevationally through the insulative tiers and the wordline tiers. The individual memory cells comprise a memory structure laterally between the gate region and the channel material. Individual of the wordlines comprise laterally-outer longitudinal-edge portions and a respective laterally-inner portion laterally adjacent individual of the laterally-outer longitudinal-edge portions. The individual laterally-outer longitudinal-edge portions project upwardly and downwardly relative to its laterally-adjacent laterally-inner portion.

In some embodiments, a memory array comprises a vertical stack comprising alternating insulative tiers and wordline tiers. The wordline tiers comprise gate regions of individual memory cells. The gate regions individually comprise part of a wordline in individual of the wordline tiers. Channel material extends elevationally through the insulative tiers and the wordline tiers. The individual memory cells comprise a memory structure laterally between the gate region and the channel material. Individual of the wordlines comprise laterally-outer longitudinal-edge portions and a laterally-inner portion laterally adjacent individual of the memory structures. Individual of the laterally-outer longitudinal-edge portions are taller than individual of the laterally-inner portions.

In some embodiments, a memory array comprises a vertical stack comprising alternating insulative tiers and wordline tiers. The wordline tiers comprise control-gate regions of individual memory cells. The control-gate regions individually comprise part of a wordline in individual of the wordline tiers. A charge-blocking region of the individual memory cells is elevationally along the individual control-gate regions. Charge-storage material of the individual memory cells is elevationally along individual of the charge-blocking regions. Channel material extends elevationally through the insulative tiers and the wordline tiers. Insulative charge-passage material is laterally between the channel material and the charge-storage material. Individual of the wordlines comprise laterally-outer longitudinal-edge portions and a respective laterally-inner portion laterally adjacent individual of the laterally-outer longitudinal-edge portions. The individual laterally-outer longitudinal-edge portions project upwardly and downwardly relative to its laterally-adjacent laterally-inner portion.

In some embodiments, a memory array comprises a vertical stack comprising alternating insulative tiers and wordline tiers. The wordline tiers comprise control-gate regions of individual memory cells. The control-gate regions individually comprise part of a wordline in individual of the wordline tiers. A charge-blocking region of the individual memory cells is elevationally along the individual control-gate regions. Charge-storage material of the individual memory cells is elevationally along individual of the charge-blocking regions. Channel material extends elevationally through the insulative tiers and the wordline tiers. Insulative charge-passage material is laterally between the channel material and the charge-storage material. Individual of the wordlines comprise laterally-outer longitudinal-edge portions and a laterally-inner portion laterally adjacent individual of the memory structures. Individual of the laterally-outer longitudinal-edge portions being taller than individual of the laterally-inner portions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array, comprising:
   forming a stack comprising vertically-alternating insulative tiers and wordline tiers, the insulative tiers comprising sacrificial material comprising opposing longitudinal edges comprising longitudinal shape of longitudinal outlines of individual wordlines to be formed in individual of the wordline tiers, the wordline tiers comprising a first conductive material of the individual wordlines to be formed;
   selectively depositing from the first conductive material a second conductive material laterally beyond the opposing longitudinal edges of the insulative tiers, the selectively-deposited second conductive material projecting upwardly and downwardly into individual of the insulative tiers and comprising part of the individual wordlines;
   after the selectively depositing, removing the sacrificial material from the insulative tiers; and
   after the removing, forming insulator material to line and less-than-fill the individual insulative tiers.

2. The method of claim 1 comprising forming the insulator material to extend elevationally completely between upwardly and downwardly projecting portions of the selectively-deposited second conductive material of immediately vertically adjacent of the wordline tiers to form longitudinally-elongated voids in the individual insulative tiers.

3. The method of claim 1 wherein the first conductive material is laterally recessed from the opposing longitudinal edges of the insulative tiers at start of the selectively depositing.

4. The method of claim 1 wherein the first and second conductive materials are of the same composition relative one another.

5. The method of claim 1 comprising:
forming channel material to extend elevationally through the insulative tiers and the wordline tiers; and
forming individual memory cells of the array to comprise a gate region and a memory structure laterally between the gate region and the channel material.

6. The method of claim 5 comprising forming the memory structure to comprise:
a charge-blocking region of the individual memory cells elevationally along the individual gate regions;
charge-storage material of the individual memory cells elevationally along individual of the charge-blocking regions; and
insulative charge-passage material laterally between the channel material and the charge-storage material.

7. A method used in forming a memory array, comprising:
forming a stack comprising vertically-alternating insulative tiers and wordline tiers, the insulative tiers and the wordline tiers comprising opposing longitudinal edges comprising longitudinal shape of longitudinal outlines of individual wordlines to be formed in individual of the wordline tiers, the wordline tiers comprising a first sacrificial material, the insulative tiers comprising a second material of different composition from that of the first sacrificial material;
selectively depositing from the first sacrificial material a third sacrificial material laterally beyond the opposing longitudinal edges of the insulative tiers, the selectively-deposited third sacrificial material projecting upwardly and downwardly into individual of the insulative tiers, the third sacrificial material being of different composition from that of the second material;
forming a fourth material directly above and directly below the selectively-deposited third sacrificial material that projects upwardly and downwardly, respectively, into the individual insulative tiers, the fourth material being of different composition from those of the first and third sacrificial materials;
removing the first and third sacrificial materials selectively relative to the second and fourth materials to form: a) upwardly and downwardly extending cavities in the fourth material, and b) wordline-tier voids; and
forming conductive material in the cavities and in the wordline-tier voids and forming the individual wordlines to comprise the conductive material that is in the cavities and that is in the wordline-tier voids.

8. The method of claim 7 wherein the first and third sacrificial materials are of the same composition relative one another.

9. The method of claim 7 wherein the second and fourth materials are of the same composition relative on another.

10. The method of claim 7 wherein the conductive material completely fills the cavities and wordline-tier voids.

11. The method of claim 7 comprising, after the forming of the conductive material, removing the second and fourth materials selectively relative to the conductive material.

12. The method of claim 7 comprising:
forming channel material to extend elevationally through the insulative tiers and the wordline tiers; and
forming individual memory cells of the array to comprise a gate region and a memory structure laterally between the gate region and the channel material.

13. The method of claim 12 comprising forming the memory structure to comprise:
a charge-blocking region of the individual memory cells elevationally along the individual gate regions;
charge-storage material of the individual memory cells elevationally along individual of the charge-blocking regions; and
insulative charge-passage material laterally between the channel material and the charge-storage material.

* * * * *